(12) United States Patent
Hu et al.

(10) Patent No.: US 12,180,068 B2
(45) Date of Patent: Dec. 31, 2024

(54) SELF-FOLDING 3D FILM ASSEMBLIES

(71) Applicant: 3M INNOVATIVE PROPERTIES COMPANY, St. Paul, MN (US)

(72) Inventors: Jia Hu, Mounds View, MN (US); Martin B. Wolk, Woodbury, MN (US); Thomas R. Corrigan, St. Paul, MN (US); Mitchell T. Nommensen, Oak Creek, WI (US); Michael Benton Free, Stillwater, MN (US); Kurt J. Halverson, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 723 days.

(21) Appl. No.: 17/413,773

(22) PCT Filed: Dec. 24, 2019

(86) PCT No.: PCT/IB2019/061349
§ 371 (c)(1),
(2) Date: Jun. 14, 2021

(87) PCT Pub. No.: WO2020/136588
PCT Pub. Date: Jul. 2, 2020

(65) Prior Publication Data
US 2022/0063991 A1    Mar. 3, 2022

Related U.S. Application Data

(60) Provisional application No. 62/785,354, filed on Dec. 27, 2018.

(51) Int. Cl.
*B81C 1/00* (2006.01)
*B32B 7/12* (2006.01)
(Continued)

(52) U.S. Cl.
CPC ........ *B81C 1/00007* (2013.01); *B81B 3/0097* (2013.01); *B81B 7/02* (2013.01); *B32B 7/12* (2013.01); *C09J 9/02* (2013.01)

(58) Field of Classification Search
None
See application file for complete search history.

(56) References Cited

U.S. PATENT DOCUMENTS

2013/0045530 A1    2/2013  Gracias
2013/0269336 A1   10/2013  O'Connell
(Continued)

FOREIGN PATENT DOCUMENTS

WO    WO 2012-109559    8/2012

OTHER PUBLICATIONS

Cui, "Pop-Up Assembly of 3D Structures Actuated by Heat Shrinkable Polymers," Smart Materials and Structures, 2017, vol. 26, 125011, pp. 1-9.
(Continued)

*Primary Examiner* — Shawn Mckinnon

(57) ABSTRACT

A substantially planar self-folding film assembly to generate a folded three-dimensional assembly. The assembly includes a flexible support substrate, adhesive elements, and folding members. The folding members include a base, a folding region, and a hinge adjacent each folding region attached at the base to the flexible support substrate by at least one of the adhesive elements. An array of polymer actuators is co-extensive, or shaped to be not co-extensive, with each of the flexible folding members. Upon activation by a patterned light to heat conversion layer, each polymer actuator is designed and configured to provide a displacement of the corresponding flexible folding member about each hinge.

13 Claims, 22 Drawing Sheets

(51) Int. Cl.
 B81B 3/00 (2006.01)
 B81B 7/02 (2006.01)
 C09J 9/02 (2006.01)

(56) References Cited

U.S. PATENT DOCUMENTS

2016/0136877 A1* 5/2016 Rogers ............... B29C 61/0616
 156/163
2017/0291819 A1 10/2017 Cho
2017/0294698 A1 10/2017 Cho

OTHER PUBLICATIONS

Danielson, "Fabrication and Characterization of Self-Folding Thermoplastic Sheets Using Unbalanced Thermal Shrinkage," Soft Matter, The Royal Society of Chemistry, 2017, vol. 13, No. 23, pp. 4224-4230.
Dowan Kim et al. Polymer Science and Technology, vol. 29, No. 1, Feb. 2018, pp. 19-25.
Hayes, "Self-Folding Origami Microstrip Antennas," IEEE Transactions on Antennas and Propagation, 2014, vol. 62, No. 10, pp. 5416-5419.
Kempaiah, "From Nature to Synthetic Systems: Shape Transformation In Soft Materials," Journal of Materials Chemistry B, 2014, vol. 02, pp. 2357-2368.
Liu, ""2D or Not 2D": Shape-Programming Polymer Sheets", Progress In Polymer Science, 2016, vol. 52, No. 79, pp. 79-106.
Liu, "Self-Folding of Polymer Sheets Using Local Light Absorption", The Royal Society of Chemistry, 2012, vol. 08, No. 06, pp. 1703-2044.
Liu, "Shape Programming of Polymeric Materials From 2D to 3D", 2013, pp. 1-226 (saved in two parts—Part 1, pp. 1-108; Part 2, pp. 109-226).
Miyashita, "Self-Folding Miniature Elastic Electric Devices", Smart Materials And Structures, 2014, vol. 23, No. 06, 094005, pp. 1-9.
Nisser, "Feedback-Controlled Self-Folding of Autonomous Robot Collectives", IEEE International Conference on Intelligent Robots and Systems, 2016, pp. 1254-1261.
Peraza-Hernandez, "Origami-Inspired Active Structures: A Synthesis and Review", Smart Materials and Structures, 2014, vol. 23, pp. 1-28.
Piqué, "Laser Origami: A New Technique for Assembling 3D Microstructures", Proceedings of The SPIE, 2012, vol. 8244, pp. 82440B-1-82440B-7.
Sundaram, "3D-Printed Self-Folding Electronics", American Chemical Society, Applied Materials and Interfaces, 2017, vol. 09, pp. 32290-32298.
Tolley, "Self-Folding Shape Memory Laminates for Automated Fabrication", IEEE International Conference on Intelligent Robots and Systems, 2013, pp. 4931-4936.
Xu, "Assembly of Micro/Nanomaterials Into Complex, Three-Dimensional Architectures by Compressive Buckling", Science, 2015, vol. 347, No. 6218, pp. 154-159.
Yan, "Mechanical Assembly of Complex, 3D Mesostructures From Releasable Multilayers of Advanced Materials", Science Advances, 2016, vol. 02, No. 09, pp. 1-11.
Zhang, "A Mechanically Driven Form of Kirigami as a Route to 3D Mesostructures in Micro/Nanomembranes", Applied Physical Sciences, 2015, vol. 112, No. 38, pp. 11757-11764.
Zhang, "Origami and Kirigami Inspired Self-Folding for Programming Three-Dimensional Shape Shifting of Polymer Sheets With Light", Extreme Mechanics Letters, 2017, vol. 11, pp. 111-120.
Zhang, "Reversible Self-Assembly of 3D Architectures Actuated by Responsive Polymers", ACS Applied Materials And Interfaces, 2017, vol. 09, No. 47, pp. 41505-41511.
International Search Report for PCT International Application No. PCT/IB2019/061349, mailed on Apr. 22, 2020, 3 pages.

* cited by examiner

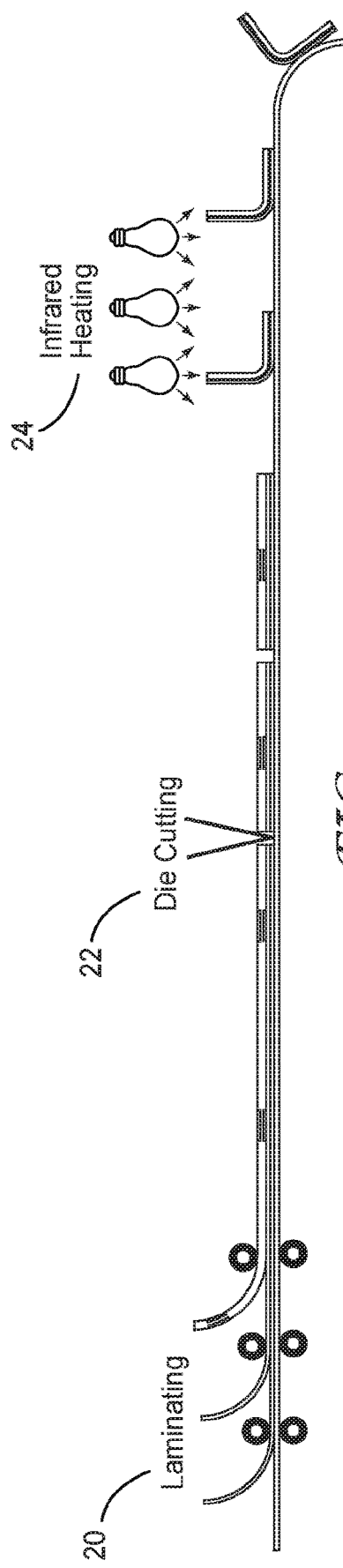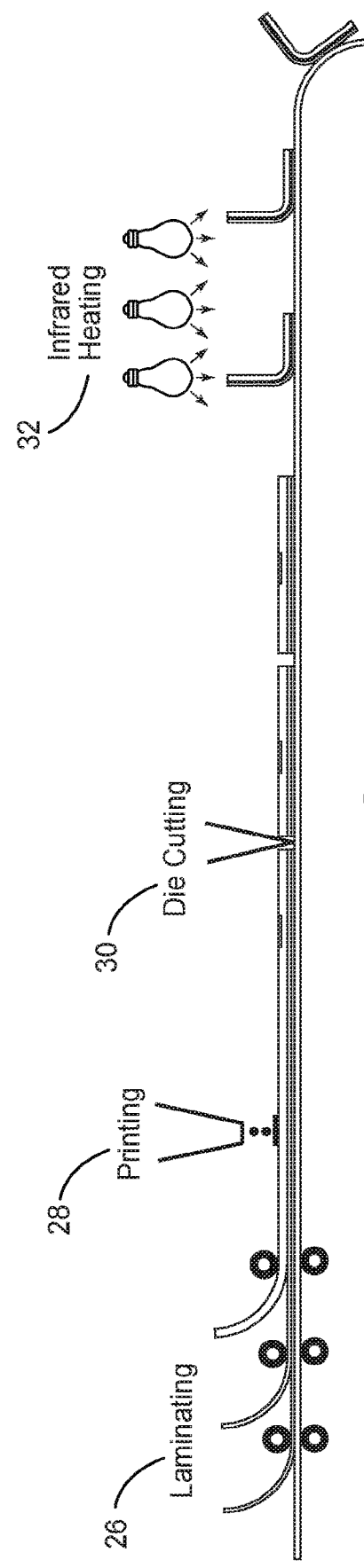

SELF-FOLDING 3D FILM ASSEMBLIES

CROSS REFERENCE TO RELATED APPLICATIONS

This application is a national stage filing under 35 U.S.C. 371 of PCT/IB2019/061349, filed Dec. 24, 2019, which claims the benefit of U.S. Provisional Application No. 62/785,354, filed Dec. 27, 2018, the disclosures of which are incorporated by reference in their entireties herein.

BACKGROUND

Origami has inspired innovative and practical designs in the fields of engineering, optics, and electronics. Methods have been reported to convert two-dimensional sheets into functional three-dimensional shapes. A need exists for new three-dimensional film assemblies formed from two-dimensional sheets.

SUMMARY

Embodiments of this invention include self-folding three-dimensional film assemblies formed, upon activation, from two-dimensional sheets, and methods to make the assemblies.

BRIEF DESCRIPTION OF THE DRAWINGS

The accompanying drawings are incorporated in and constitute a part of this specification and, together with the description, explain the advantages and principles of the invention. In the drawings.

FIG. 3 is a diagram of a roll-to-roll process for fabricating self-folding arrays using preprinted lines to heat converters;

FIG. 4 is a diagram of roll-to-roll process for fabricating self-folding arrays with digitally printed lines to heat converters;

DETAILED DESCRIPTION

I. Self-Folding Films with Co-Extensive Actuators

Described herein is a method to fabricate self-folding film arrays that can be useful as film products. The method can be used to process the arrays in roll form through multiple steps (coating, patterning, lamination, kiss cutting, scoring, printing, and other steps) before sheeting of the films and thermal actuation to a directional article. The arrays comprise a flexible support film, a folding member, and pre-strained polymer actuators.

A method described herein uses roll-to-roll process technology to facilitate the scaling of film folding techniques to an industrial level. This method enables the production of large arrays of three-dimensional (3D) elements on wide support substrates (e.g., 1 m in width) using standard production techniques (e.g., coating, patterning, lamination, kiss cutting, scoring, printing, bonding, converting, etc.). The rolls are processed flat, converted to sheets or parts, and then actuated to arrays of 3D elements as a possible final step. The films can be optionally laminated to rigid substrates.

The method described herein relies on actuation by pre-strained polymers. Films such as GRAFIX shrink films (Graphic Arts Systems, Inc.) or SHRINKY DINKS pre-strained polystyrene films (Shrinky Dinks Holdings, LLC) have been partially crosslinked and then biaxially oriented. Heating the films above the glass transition temperature results in isotropic shrinkage (~46% in the case of Shrinky-Dinks® film).

The thermal self-folding process can be accomplished with uniform heating (e.g., immersion in an oven), surface heating (e.g., a light to heat converting coating on the top surface), or local heating (e.g., a printed light to heat converting ink or toner).

The examples described herein used the printed light to heat conversion ink approach to confine the shrinkage to the hinge line and effect actuation of a flexible folding member about the hinge. The folding member material was varied to represent a number of potential applications of the self-folding article (Table 1).

TABLE 1

Folding Member Materials

| Folding Member Material | Type |
| --- | --- |
| high modulus polymer | mechanical |
| copper on polyimide | electrical |
| reflector, polarizer, microlens array, diffractive optical element | optical |

Figure 1:
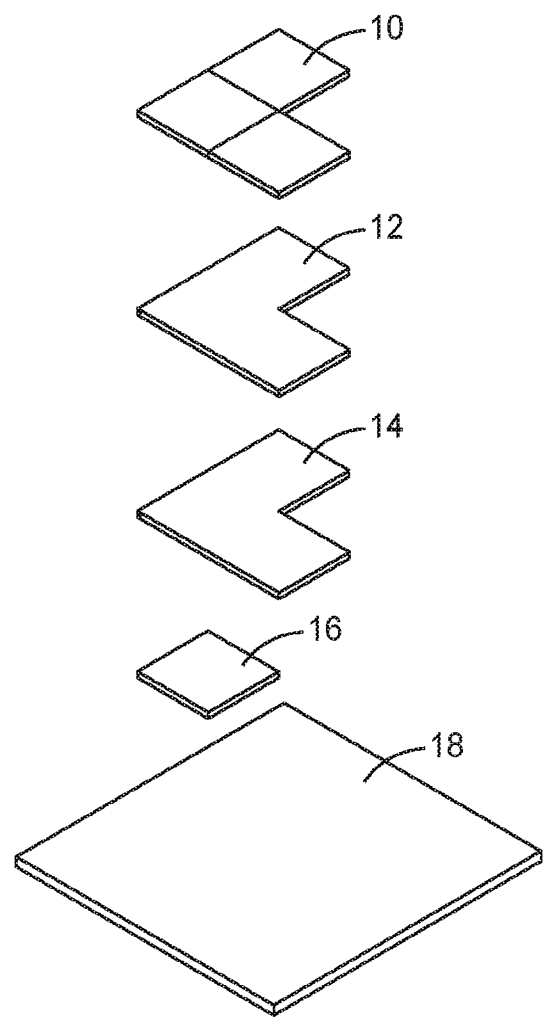
FIG. 1 is an exploded view of a self-folding array element.

For some examples, the assembly comprised, arranged as shown in FIG. 1, a flexible support substrate 18 used to provide mechanical integrity during the fabrication process and in the final application, a first adhesive layer 16 to bond the folding assembly to the support substrate, a flexible folding member 14 to provide functionality to the folded article, a second adhesive layer 12 to bond the folding member to the actuator, and a pre-strained polymer actuator 10 to provide the folding force, and a printed light to heat converter (top surface of actuator 10) to absorb incident infrared radiation and heat the assembly locally.

Figure 2:
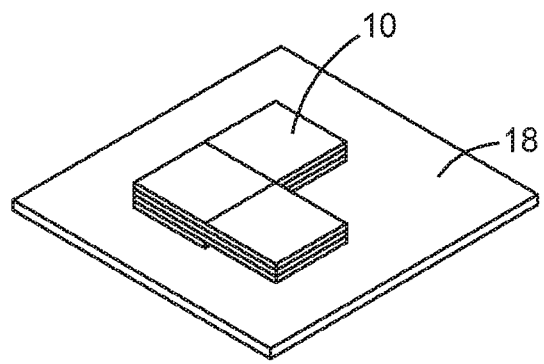
FIG. 2 is a perspective view of a self-folding array element as assembled.

FIG. 2 is a perspective view of a self-folding array element as assembled. Actuator 10 is co-extensive with folding member 14 such that actuator 10 has substantially the same planar shape as folding member 14. The layers of the assembly shown in FIG. 1 are all adhered together via first adhesive layer 16 and second adhesive layer 12, as shown in FIG. 2.

Table 2 provides exemplary components for the film assembly of FIGS. 1-2.

TABLE 2

Self-Folding Assembly Components

| Component | Function | Representative Material |
| --- | --- | --- |
| flexible support substrate | mechanical support | PET, PI, PC |
| first adhesive layer | bonding of flexible folding member to support. A conductive adhesive is used in the case of electrical assemblies | 3M 94210 |
| flexible folding member | functional layer | PET, copper on PI, PC, 3M ESR, microlens array film, 3M DBEF, etc. |
| second adhesive layer | bonding of flexible folding member to actuator | 3M 94210 |
| pre-strained polymer | Actuation | pre-strained PC or PET |
| light to heat converter | light absorption and heating | carbon black based toner or ink |

FIG. 3 is a diagram of a roll-to-roll process for fabricating self-folding arrays using preprinted lines to heat converters, including the steps of laminating the pre-printed layers of the arrays (20) such as those layers shown in FIG. 1, die cutting the laminated arrays (22), and infrared heating the die cut arrays for activation and folding (24).

FIG. 4 is a diagram of roll-to-roll process for fabricating self-folding arrays with digitally printed lines to heat converters, including the steps of laminating the layers of the arrays (26) such as those layers shown in FIG. 1, digitally printing the laminated arrays (28), die cutting the laminated arrays (30), and infrared heating the die cut arrays for activation and folding (32).

II. Self-Folding Films with Shaped Actuators

The use of shaped pre-strained polymer actuators in the fabrication of self-folding film arrays can be useful in film products. A method can be used to process the arrays in roll form through multiple steps (coating, patterning, lamination, kiss cutting, scoring, and other steps) before sheeting of the films and thermal actuation to a three-dimensional article. The arrays comprise a flexible support film, a folding member, and shaped pre-strained polymer actuators. Shaped actuators allow for the individual tailoring of the force/displacement curve for each folding member of such an array.

A method described herein uses roll-to-roll process technology to facilitate the scaling of film folding techniques to an industrial level. This method enables the production of large arrays of 3D elements on wide support substrates (e.g., 1 m in width) using standard production techniques (e.g., coating, patterning, lamination, kiss cutting, scoring, printing, bonding, converting, and other steps). The rolls are processed flat, converted to sheets or parts, and then actuated to arrays of 3D elements as a final step.

The method relies on actuation by shaped pre-strained polymers. In contrast to the use of co-extensive pre-strained polymer actuators, the shaped pre-strained polymer actuators are not co-extensive with the folding member. Their shape is independent of a shape of a corresponding folding member, as illustrated in FIGS. 5B-5D.

Figure 5D:
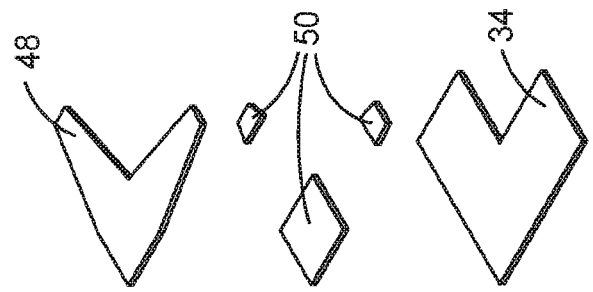
FIGS. 5A-5D are exploded diagrams of exemplary folding members with co-extensive or shaped pre-strained polymer actuators.
Figure 5C:
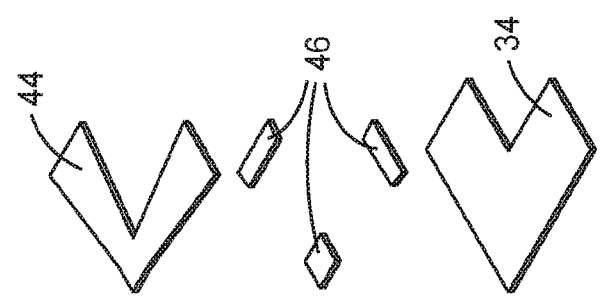
Figure 5B:
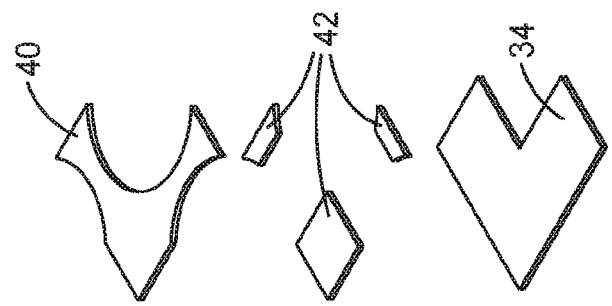
Figure 5A:
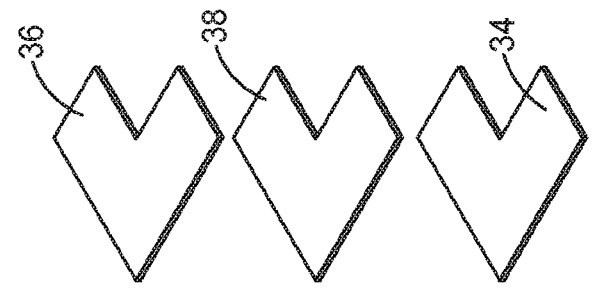

FIGS. 5A-5D are exploded diagrams of exemplary folding member designs with co-extensive or shaped pre-strained polymer actuators. FIG. 5A illustrates a folding member 34 with a co-extensive pre-strained polymer actuator 36 secured to folding member 34 by adhesive 38. FIG. 5B illustrates folding member 34 with a shaped pre-strained polymer actuator 40 secured to folding member 34 by adhesive 42. FIG. 5C illustrates folding member 34 with a shaped pre-strained polymer actuator 44 secured to folding member 34 by adhesive 46. FIG. 5D illustrates folding member 34 with a shaped pre-strained polymer actuator 48 secured to folding member 34 by adhesive 50.

The process used to make the shaped pre-strained polymer actuators enables the design and control of a number of actuator parameters, hence a large degree of control of the folding process.

Point Attachment—The shaped pre-strained polymer actuators can be attached at prescribed points on the surface of a folding member using patterned adhesives, ultrasonic welding, laser welding, or other physical means of bonding (micro-rivets, etc.). Control of the attachment points can also be achieved by shaping the folding member 34, either by removing material completely before lamination, or by structuring the surface of the folding member so only certain regions are bonded during lamination. Microreplication could be used to control the surface morphology.

Figure 6A:
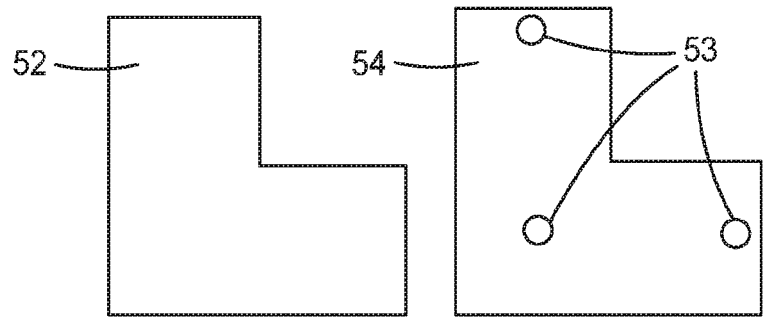
FIGS. 6A-6D are top views illustrating exemplary attachment points for pre-strained polymer actuators on folding members.
Figure 6B:
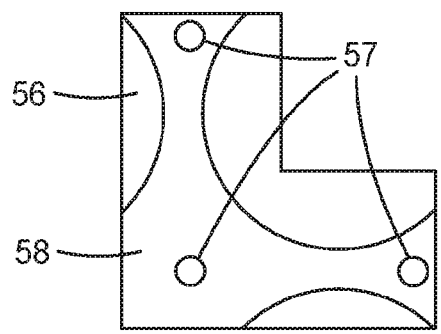
Figure 6C:
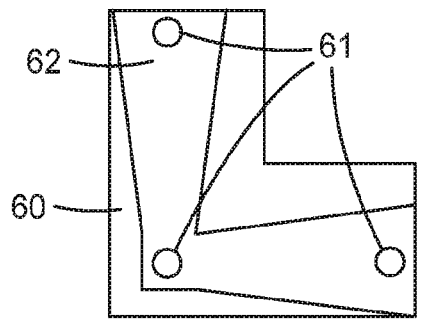
Figure 6D:
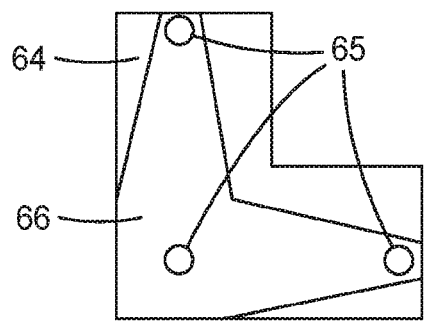

FIGS. 6A-6D are top views illustrating exemplary attachment points for pre-strained polymer actuators on folding members. FIG. 6A illustrates an actuator 54 co-extensive with a folding member 52 and with attachment points 53 between them. FIG. 6B illustrates a shaped actuator 58 secured to a folding member 56 at attachment points 57. FIG. 6C illustrates a shaped actuator 62 secured to a folding member 60 at attachment points 61. FIG. 6D illustrates a shaped actuator 66 secured to a folding member 64 at attachment points 65.

Multi-element Arrays—The shaped pre-strained polymer actuators are amenable to the fabrication of large folding member arrays, such as those likely to be produced by a roll-to-roll process. The process would involve point attachment following by rotary die or laser kiss cutting and removal of the interstitial material (the "weed").

Mixed Array Fabrication—The process described above can be modified to enable a range of actuator performance arising from the use of shaped pre-strained polymer actuators of different composition, thermal characteristics, design, or caliper. First, the lamination and kiss cutting process can be performed more than once with actuator sheets of different composition variables (e.g., crosslink density, chemical composition, degree of pre-strain). Second, the lamination and kiss cutting process can be performed with single or multiple actuator sheets in which the design and shape of the actuator (and its attachment points) can be varied over the array. Finally, the caliper of the actuator sheet can be changed in order to affect the actuation force. This change in caliper can also be achieved through microreplication of that film layer.

Overlapped or Woven Actuators—The process described above allows for the overlapping, interleaving, or weaving of actuators. This is not possible with co-extensive pre-strained polymer actuators. Furthermore, overlapped or woven actuators can provide for a hierarchical structure of bends in the folding members, where one folding member bends or folds off of another folding member. In this case, one folding member can be the base or support for another folding member.

Figure 7A:
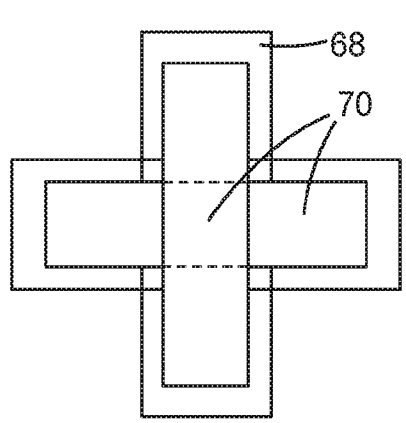
FIGS. 7A-7B are top views illustrating overlapped or interleaved pre-strained polymer actuators on folding members.
Figure 7B:
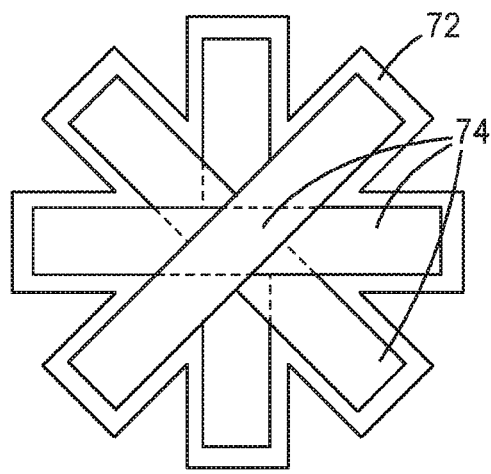

FIGS. 7A-7B are top views illustrating overlapped or interleaved pre-strained polymer actuators on folding members. FIG. 7A illustrates overlapping actuators 70 secured to a folding member 68. FIG. 7B illustrates woven or interleaved actuators 74 secured to a folding member 72.

Sequencing—The process described above enables the use of multiple shaped pre-strained polymer actuators with a range of thermal and photo-physical responses in the fabrication of a folding array. For example, the mixed array method can produce arrays with pre-strained polymer actuators having different glass transition temperatures. The resulting array will have actuation sequence that occurs over a thermal process profile. Arrays can be prepared that are photothermally actuated with different light sources (e.g., the light to heat conversion material in the pre-strained polymer actuators are spectrally unique).

Embossing—The shaped pre-strained polymer actuator sheets can be embossed or perforated during their fabrication to provide shaped cross-sectional profiles (e.g., ribs, grooves, hole arrays, etc.) that affect their shrinkage behavior. The mixed array approach can be used to create arrays with a range of embossed features on the same support substrate.

Figure 8A:
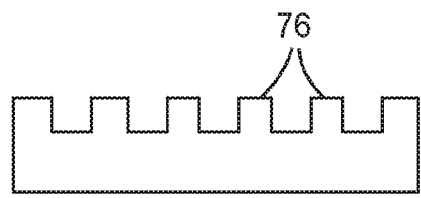
FIGS. 8A-8D are side sectional views of exemplary constructions for pre-strained polymer actuators.
Figure 8B:
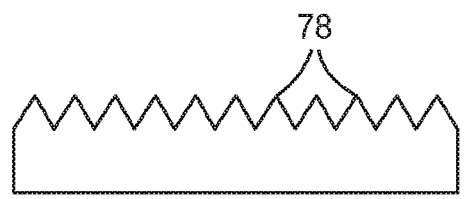
Figure 8C:
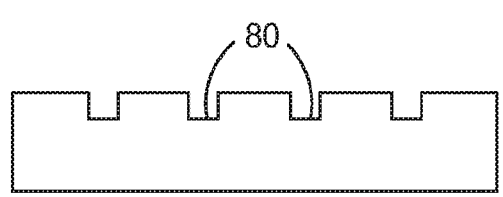
Figure 8D:
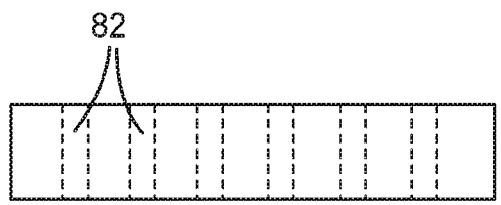

FIGS. 8A-8D are side cross-sectional views of exemplary constructions for pre-strained polymer actuators. FIG. 8A illustrates a pre-strained polymer actuator with square wave ribs 76. FIG. 8B illustrates a pre-strained polymer actuator with sawtooth wave ribs 78. FIG. 8C illustrates a pre-strained polymer actuator with grooves 80. FIG. 8D illustrates a pre-strained polymer actuator with a hole array 82.

For some examples, the assembly comprised a flexible support substrate used to provide mechanical integrity during the fabrication process and in the final application, a first adhesive layer to bond the folding assembly to the support substrate, a flexible folding member to provide functionality to the folded article, a second adhesive layer to bond the folding member to the actuator in specific anchor points, and a pre-strained polymer actuator to provide the folding force.

Figure 9:
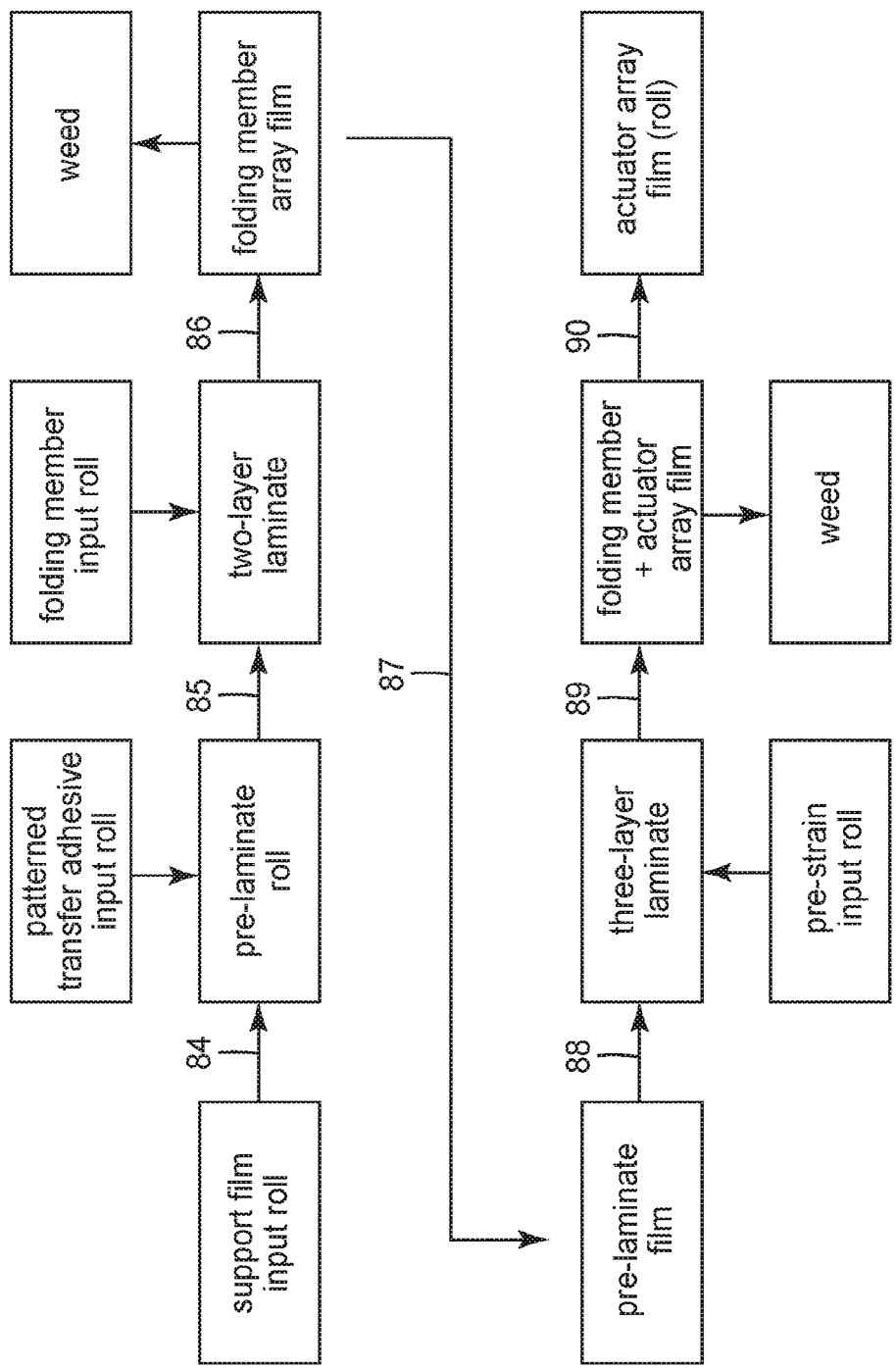
FIG. 9 is a flow chart of a continuous roll-to-roll manufacturing process for self-folding members with pre-strained polymer actuators.

1. Roll-to-Roll Process for Fabricating Self-Folding Arrays with Shaped Actuators A roll-to-roll method described herein involves a continuous support film as an input roll to a multi-step process. The individual steps can be identical to the corresponding steps in the batch samples described above, except that they have been adapted for continuous processing, as illustrated in the flow chart of FIG. 9. This process includes the following steps.

Patterned transfer adhesive is applied to a support film to define the attachment points for folding members (84). There is a one-to-one correspondence between the transferred adhesive pads and each folding member of a large array. The unpatterned folding member input roll is laminated to the support film (85), adhering only where the adhesive pads are located. The folding member film is then kiss cut (laser or rotary die) and weeded to form the folding member array film (86). Adhesive is applied in small regions for bonding of the pre-strained film (87). The pre-strained film is applied and patterned (laser or rotary die) (88, 89)) and weeded to form the final actuator array film (90).

2. Roll-to-Sheet Process Options for Packaging Self-Folding Arrays with Shaped Actuators This process provides a manufacturer with two options for products: a flat, sheeted product with a latent 3D structure or a 3D product that has been transformed before packaging, as shown in the flow chart of FIG. 10. This process includes the following steps: sheeting or converting of the array film (91); actuation (2D to 3D transformation) of the array film (92); and packaging for part or sheet for sale (93).

Figure 10:
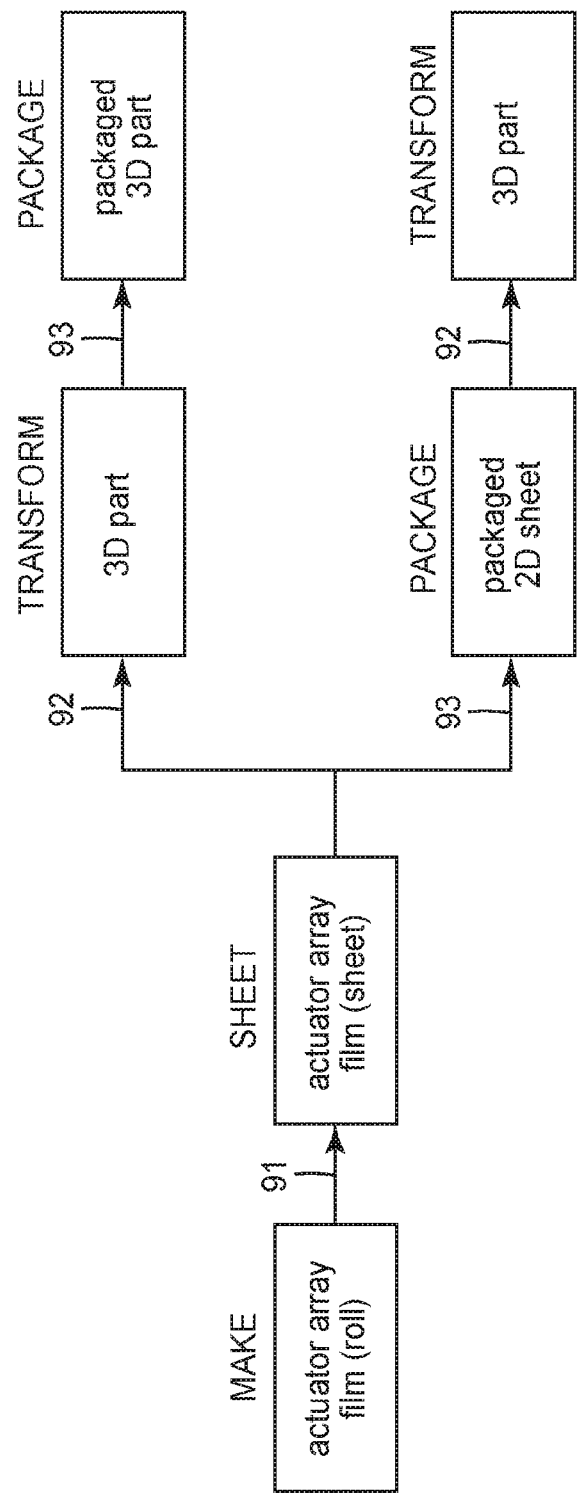
FIG. 10 is a flow chart of a roll-to-sheet manufacturing process for distribution of self-folding members with pre-strained polymer actuators.

As shown in FIG. 10, the two options are: (1) make, sheet, transform, package (selling 3D part); or (2) make, sheet, package, transform (selling 2D sheet). Option 2 provides an advantage of smaller packaging and easier handling for processing of the product.

III. Self-Folding Films with Uniaxial Pre-Strained Actuators

The use of anisotropic pre-strained polymer actuators in the fabrication of self-folding film arrays can be useful in film products. A method described herein can be used to process the arrays in roll form through multiple steps (coating, patterning, lamination, kiss cutting, scoring, and other steps) before sheeting of the films and thermal actuation to a three-dimensional article. The arrays comprise a flexible support film, a folding member, and uniaxial pre-strained polymer actuators. Uniaxial actuators allow for the individual tailoring of the actuation force and direction for each folding member of such an array based on the orientation of the uniaxial pre-strained polymer actuators relative to the actuation axis. The actuation force can be tailored to be asymmetric or provide for twisting, for example.

A method described herein uses roll-to-roll process technology to facilitate the scaling of film folding techniques to an industrial level. This method enables the production of large arrays of 3D elements on wide support substrates (e.g., 1 m in width) using standard production techniques (e.g., coating, patterning, lamination, kiss cutting, scoring, printing, bonding, converting, etc.). The rolls are processed flat, converted to sheets or parts, and then actuated to form arrays of 3D elements as a final step.

In this embodiment, the mechanical folding force for actuating these assemblies is provided by a uniaxial pre-strained polymers. Uniaxial pre-strained polymer actuators are thermoplastic shape memory materials that have been strained uniaxially (e.g., through longitudinal orientation) above their glass transition temperature and then cooled to freeze in the strain. In contrast to biaxial pre-strained polymers, which shrink in two dimensions, the uniaxial pre-strained polymer actuators can be transformed from one shape to another of lower potential energy by strain relief primarily along one axis (the pre-strain axis), as illustrated in FIGS. 11A-11B.

Figure 11A:
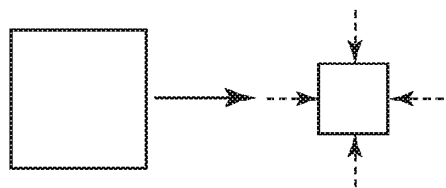
FIGS. 11A-11B are top views illustrating shrinkage in biaxial and uniaxial pre-strained polymer actuators.
Figure 11B:
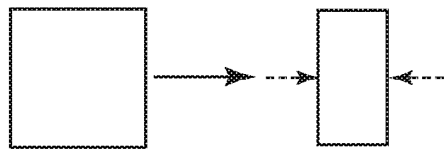

FIGS. 11A-11B are top views illustrating shrinkage in biaxial and uniaxial pre-strained polymer actuators. FIG. 11A illustrates shrinkage in two mutually orthogonal directions (biaxial), and FIG. 11B illustrates shrinkage along a single axis.

Uniaxial pre-strained polymer actuators allow for the individual tailoring of the actuation force and direction for each folding member of such an array based on the orientation of the uniaxial pre-strained polymer actuators relative to the actuation axis (e.g., the angle between the fold axis and the pre-strain axis). In order to demonstrate this utility, a series of assemblies were prepared based on a flexible support substrate, a first adhesive layer, a flexible folding member, a second adhesive layer, and a uniaxial pre-strained polymer actuator (Table 3), as further described and illustrated in the Examples.

TABLE 3

Elements of a Self-Folding Assembly

| Item | Function | Comments |
| --- | --- | --- |
| flexible support substrate | mechanical support | Any film, sheet, or foil that is available in roll form and is dimensionally stable under the actuation conditions |
| first adhesive layer | bonding of base portion of the flexible folding member to flexible support substrate | Options include direct bonding of the two elements by an ultrasonic or laser bonding process. Direct bonding would obviate the need for this adhesive layer. |
| flexible folding member | functional layer | Flexible folding member has a fold line (hinge) and a fold axis parallel to the fold line. |
| second adhesive layer | bonding of flexible folding member to pre-strained polymer actuator | Other options include direct bonding of the two elements by an ultrasonic or laser bonding process. Direct bonding would obviate the need for this adhesive layer. |
| uniaxial pre-strained polymer actuator | provides mechanical folding force, primarily along the pre-strain axis. | Thermoplastic film with a $T_g$ and a pre-strain axis. Pre-strain axis can be aligned with fold axis or offset at an angle. |

Figure 12:
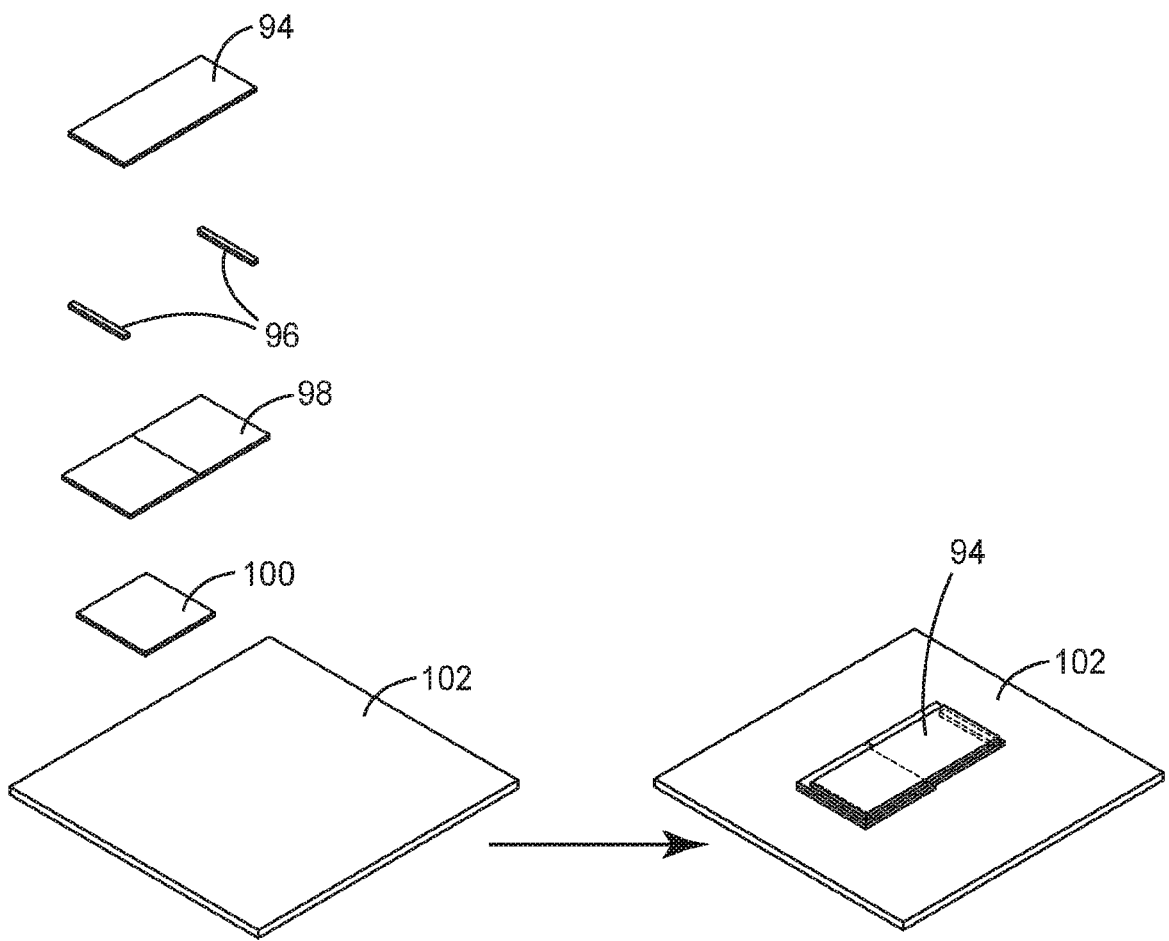
FIG. 12 is a diagram having an exploded view of a self-folding assembly with a uniaxial pre-strained polymer actuator and a view of the assembly as assembled.

FIG. 12 is a diagram having an exploded view of a self-folding assembly with a uniaxial pre-strained polymer actuator and a view of the assembly as assembled. As shown in FIG. 12, the assembly includes, arranged as shown, a flexible support substrate 102, a first adhesive layer 100, a flexible folding member 98, a second adhesive layer 96, and a pre-strained polymer actuator 94.

The process used to make the shaped uniaxial pre-strained polymer actuators enables the design and control of a number of actuator parameters, hence a large degree of control of the folding process. The following are three examples.

Figure 13:
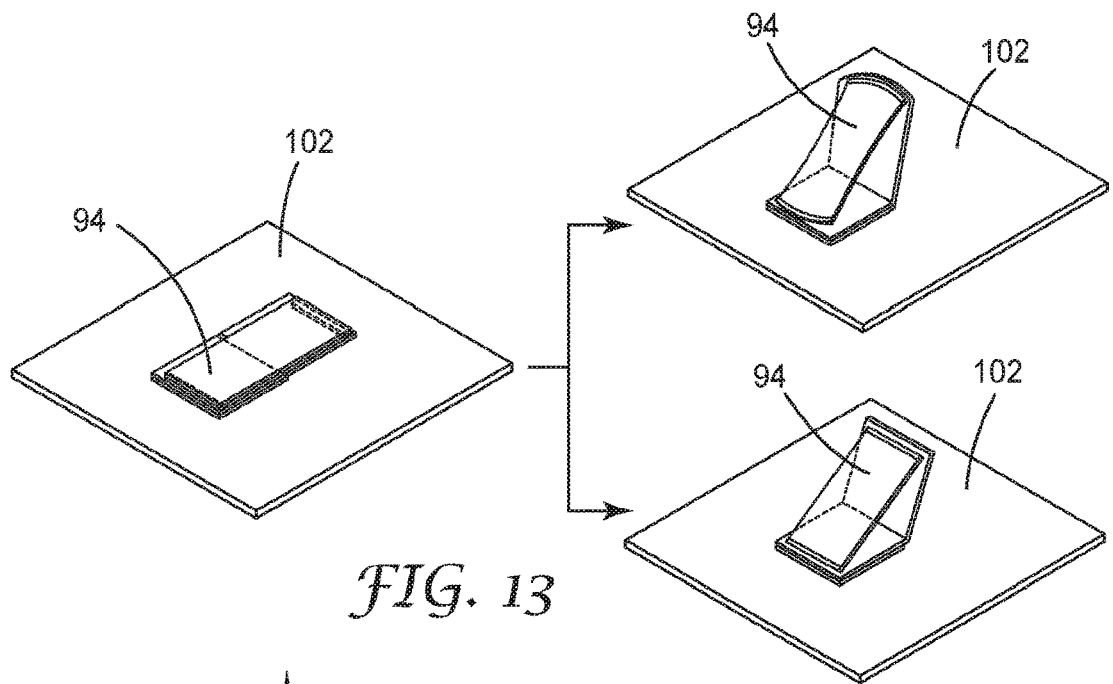
FIG. 13 is a perspective view illustrating curl reduction in uniaxial pre-strained polymer actuators.

Curl Reduction or Elimination—Folding assemblies made with biaxial pre-strained polymer actuators exhibit curl during the thermally induced folding process since shrinkage occurs both parallel and perpendicular to the fold axis. Assemblies fabricated with the fold axis perpendicular to the pre-strain axis exhibit no visible sign of curl after actuation. FIG. 13 is a perspective view illustrating curl reduction in uniaxial pre-strained polymer actuator 94 on support substrates 102.

Figure 14:
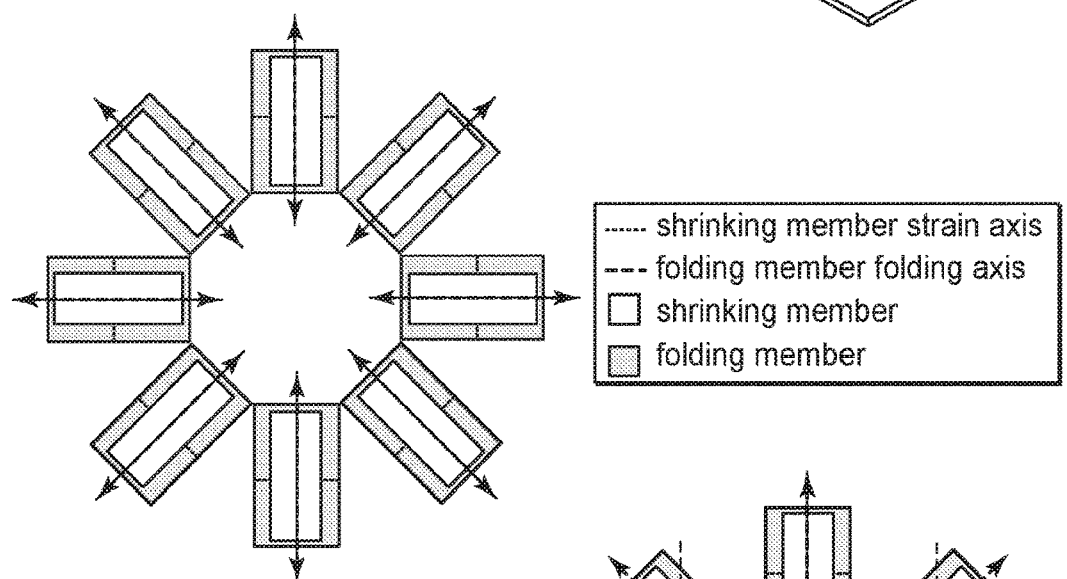
FIG. 14 is a top view of a self-folding array where a uniaxial pre-strained polymer actuator strain axis is parallel to a folding member fold axis.

Folding Arrays with Multiple Element Orientations—Folding assembly arrays made with biaxial pre-strained polymer actuators with a range of folding axis angles can be fabricated in such a way such that each array element has a single, optimal fold axis/pre-strain axis offset (e.g., 90°). Fabrication of arrays with multiple offset angles can be performed by rotation of the uniaxial pre-strained polymer actuator film prior to bonding to the folding member. FIG. 14 is a top view of a self-folding array where a uniaxial pre-strained polymer actuator strain axis is parallel to a folding member fold axis.

Figure 15:
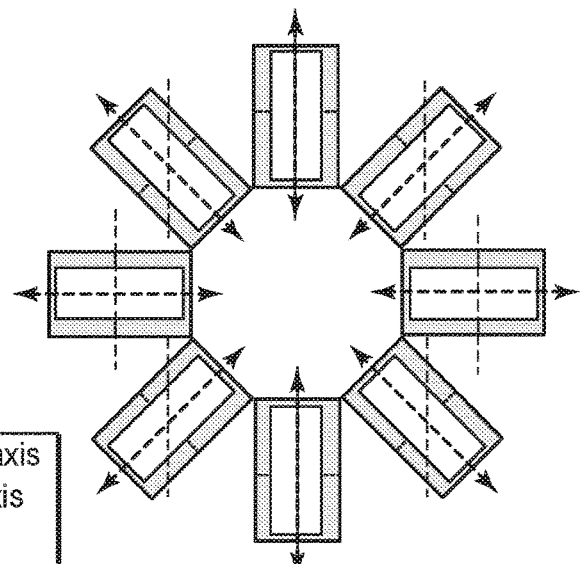
FIG. 15 is a top view of a self-folding array where a uniaxial pre-strained polymer actuator strain axis is independent of a folding member fold axis.

Twisted Folds—Folding assembly arrays made with biaxial pre-strained polymer actuators with a range of folding axis angles can be fabricated in such a way such that each array element has a unique fold axis/pre-strain axis offset (e.g., 90°). Fabrication of arrays with multiple offset angles can be performed by rotation of the uniaxial pre-strained polymer actuator film prior to bonding to the folding member. The effect of the angular offset is to impart a twist about the pre-strain axis. The example provided is an array, but control over twist angle can be useful for single, isolated elements. FIG. 15 is a top view of a self-folding array where a uniaxial pre-strained polymer actuator strain axis is independent of a folding member fold axis.

Figure 16C:
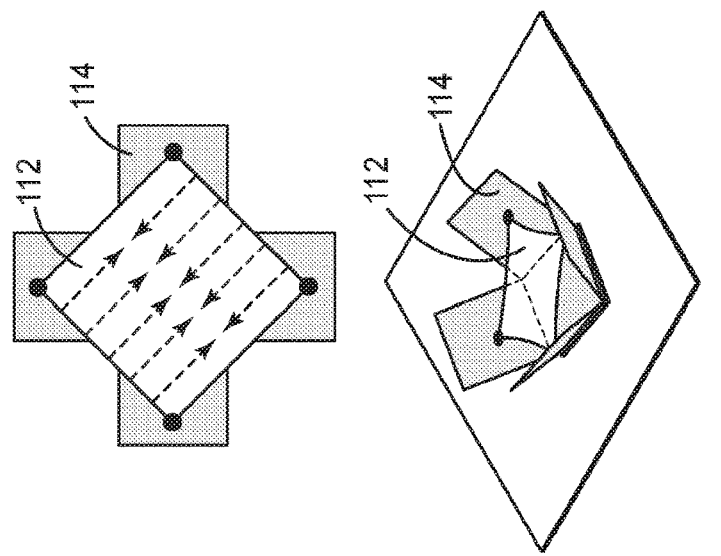
FIGS. 16A-16C are top and corresponding perspective views illustrating uniaxial pre-strained polymer actuators with a strain axis aligned with one or multiple fold axes of folding members.
Figure 16B:
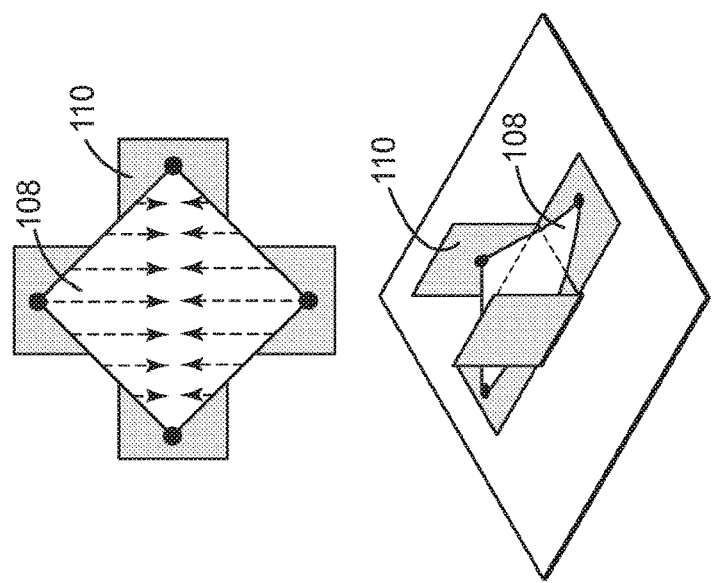
Figure 16A:
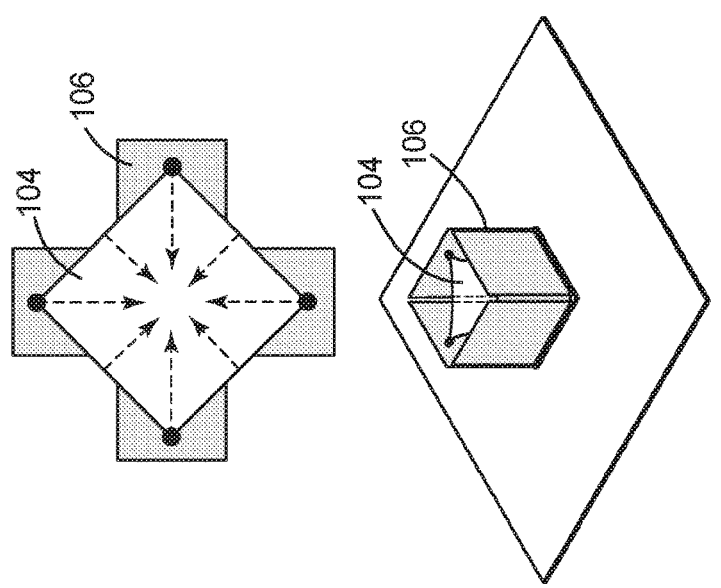

Selective Folding by Orientation—Folding assemblies with a single uniaxial pre-strained polymer actuator and multiple fold axes arrays can be fabricated in such a way such that each folding element has a unique action upon actuation. The effect is illustrated with a self-folding box as shown in FIGS. 16A-16C. In the first example as shown in FIG. 16A, a biaxial pre-strained polymer actuator 104 provides uniform folding of all four box sides 106. In the second example as shown in FIG. 16B, orientation of the uniaxial pre-strained polymer actuator 108 pre-strain axis perpendicular to two of the fold axes and parallel to the two remaining fold axes provides differential folding of neighboring box sides 110. In the third example as shown in FIG. 16C, a 45° offset between the uniaxial pre-strained polymer actuator 112 pre-strain axis and all of the fold axes of box 114 provides a reduced, but uniform, folding action.

Figure 17:
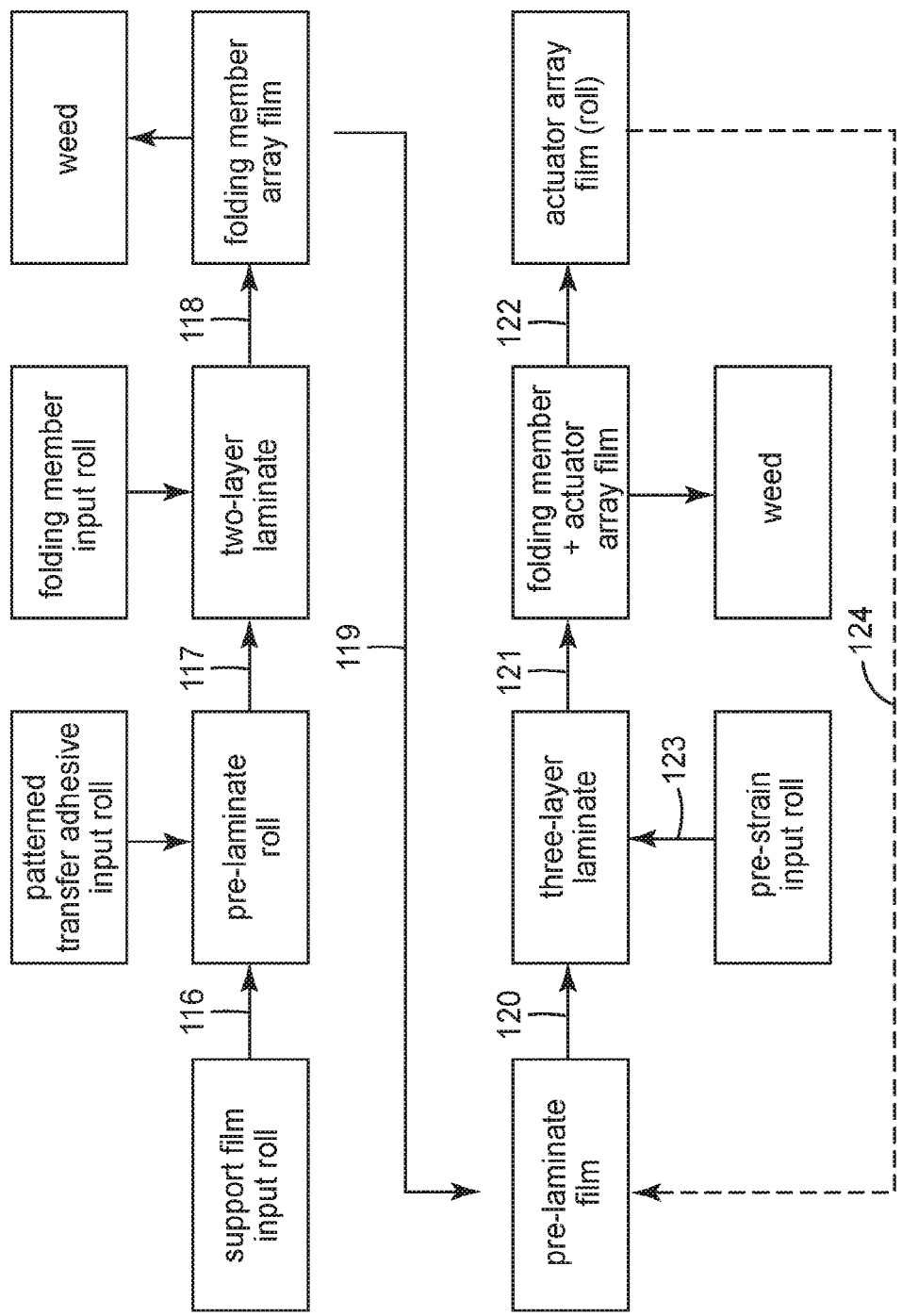
FIG. 17 is a flow chart of a continuous roll-to-roll manufacturing process for self-folding arrays with uniaxial pre-strained polymer actuators.

1. Roll-to-Roll Process for Fabricating Self-Folding Arrays with Pre-Strained Actuators This roll-to-roll method involves a continuous support film as an input roll to a multi-step process. The individual steps can be identical to the corresponding steps in the batch samples described above, except that they have been adapted for continuous processing, as shown in the flow chart of FIG. 17. This process includes the following steps.

Patterned transfer adhesive is applied to a support film to define the attachment points for folding members (116). There is a one-to-one correspondence between the transferred adhesive pads and each folding member of a large array. The unpatterned folding member input roll is laminated to the support film (117), adhering only where the adhesive pads are located. The folding member film is then kiss cut (laser or rotary die) (118) and weeded to form the folding member array film. Adhesive is applied in small regions for bonding of the pre-strained film (119). The pre-strained film is applied and laminated (120, 123) and patterned (laser or rotary die) (121) and weeded to form the final actuator array film (122). This process also includes a path for creating multiple offset angles (124).

2. Roll-to-Sheet Process Options for Packaging Self-Folding Arrays with Pre-Strained Actuators This process provides a manufacturer with two options for products: a flat, sheeted product with a latent 3D structure or a 3D product that has been transformed before packaging, as illustrated in the flow chart of FIG. 18.

This process includes the following steps: sheeting or converting of the array film (126); actuation (2D to 3D transformation) of the array film (127); and packaging for part or sheet for sale (128).

Figure 18:
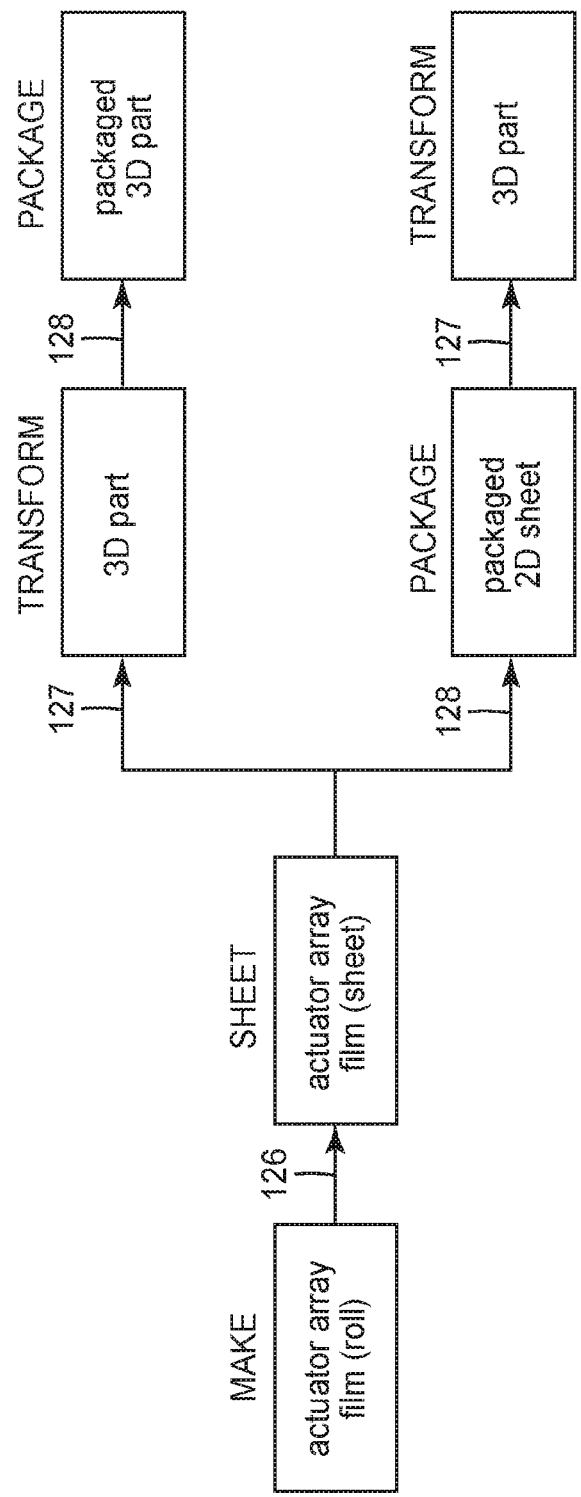
FIG. 18 is a flow chart of a roll-to-sheet manufacturing process for distribution of self-folding members with uniaxial pre-strained polymer actuators.

As shown in FIG. 18, the two options are: (1) make, sheet, transform, package (selling 3D part); or (2) make, sheet, package, transform (selling 2D sheet). Option 2 provides an advantage of smaller packaging and easier handling for processing of the product.

EXAMPLES

The thermomechanical actuators used in the following examples were optically transparent, pre-strained polystyrene sheets with coating for inkjet printing. Black lines were printed on them with HP Laser Jet CP4025. When they were exposed to infrared heating, they absorbed heat only along a printed line, only a line or lines of the material were heated and shrank, causing the sheets to fold permanently under heat.

Prior to heating, functional film were laminated to those shrinkable sheets by various means. When the assembly of sheets and films were heated under infrared lights, the assembly of functional films folded along printed lines, forming 3D functional structure from their originally flat 2D form.

The thermomechanical sheets also can be any polymers in sheet form that will bend when it is heated along a line. Some Shape Memory Polymers (SMP) in sheets or film forms should have such a property.

1. Self-Folding Array of Half Cubes

General Description: The target article is an array of self-folding PET flexible members, each with an "L" shape of three square regions. The central square region is adhered to a flexible support substrate. The other two square regions are attached to the central square region by a hinge and are designed to fold upwards by 90 degrees upon exposure to an infrared heat source.

Figure 19:
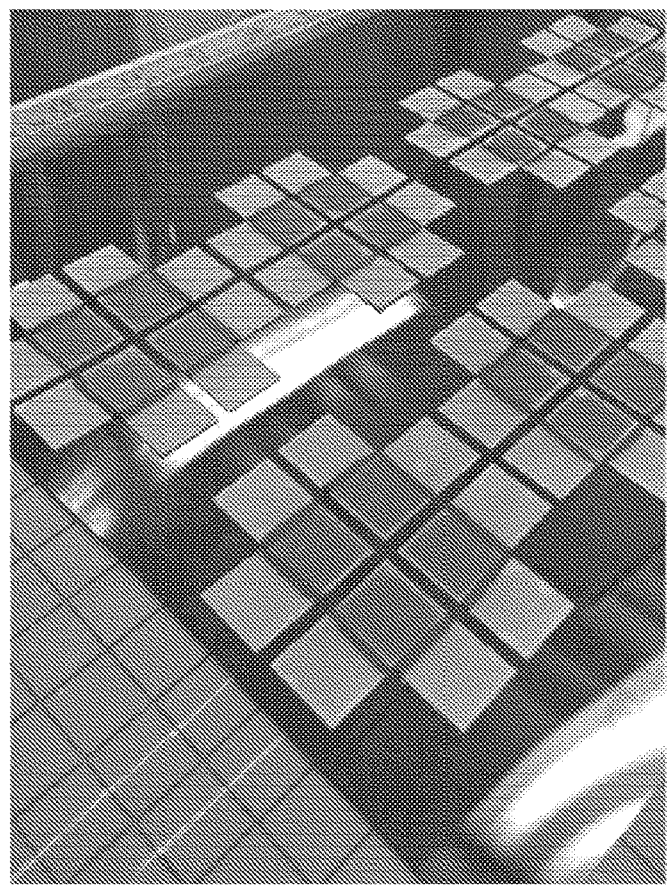
FIGS. 19-37 are images for the Examples.
Figure 20:

FIGS. 19 and 20 are images showing these self-folding array assemblies before heating (FIG. 19) and after heating (FIG. 20).

Flexible Support Substrate/Adhesive Laminate: A double-coated transfer tape with liner (94210, 3M Company St. Paul, MN) was kiss-cut using a laser cutting system (ILS10.150D, Universal Laser Systems, Scottsdale, AZ) to form isolated adhesive regions corresponding to the positions of the square base of each flexible folding member in the final assembly. The contiguous weed from the patterning step was removed to leave behind non-contiguous patterned adhesive segments on the tape backing. The patterned double coated tape was then hand laminated, adhesive side down, onto 5 mil KAPTON polyimide film (Dupont, Wilmington, DE). Once laminated, the tape liner was removed, leaving the patterned non-contiguous adhesive regions on the polyimide film.

Patterned Pre-Strained Polymer/Adhesive Laminate: The light to heat conversion patterns on the pre-strained polymer film (Ink Jet Shrink Film, GRAFIX film) were applied using an inkjet printer (HP Laser Jet CP4025). After printing, a double coated tape (94210, 3M Company) was laminated to the non-printed side of the pre-strained polymer film. The liner was then removed from the transfer adhesive tape and the assembly to the flexible folding member film (2 mil PET film). The laminate was score cut into the PET side of composite film using a laser cutter (ILS10.150D, Universal Laser Systems, Scottsdale, AZ). The three-layer film construction was laminated onto the flexible support substrate/adhesive laminate in registration so that the patterned first adhesive layer was aligned to the square base region of the pre-strained polymer laminate.

Fabricating the features: A laser cutting system (ILS10.150D, Universal Laser Systems, Scottsdale, AZ) was used to cut through the topmost three layers of the five layer assembly using the parameters listed in Table 4. Once cut, the continuous web from the three-layer film element stack was removed to leave behind the patterned features adhered to the polyimide substrate.

TABLE 4

| Laser parameters for example 3 | |
| --- | --- |
| Laser Parameter | Value |
| cutting power | 15% (150 W) |
| pulse density | 600 pulses/in |
| z-height | 2 mil |
| head speed | 60% (X in/sec) |

Activating the Elements: The self-folding array was placed 1 inch below an incandescent infrared lamp (250 W, R40, GE Lighting) for 60 seconds, over which the features exhibited self-folding to their final position.

2. Array of Self-Folding Optical Element

Figure 21:
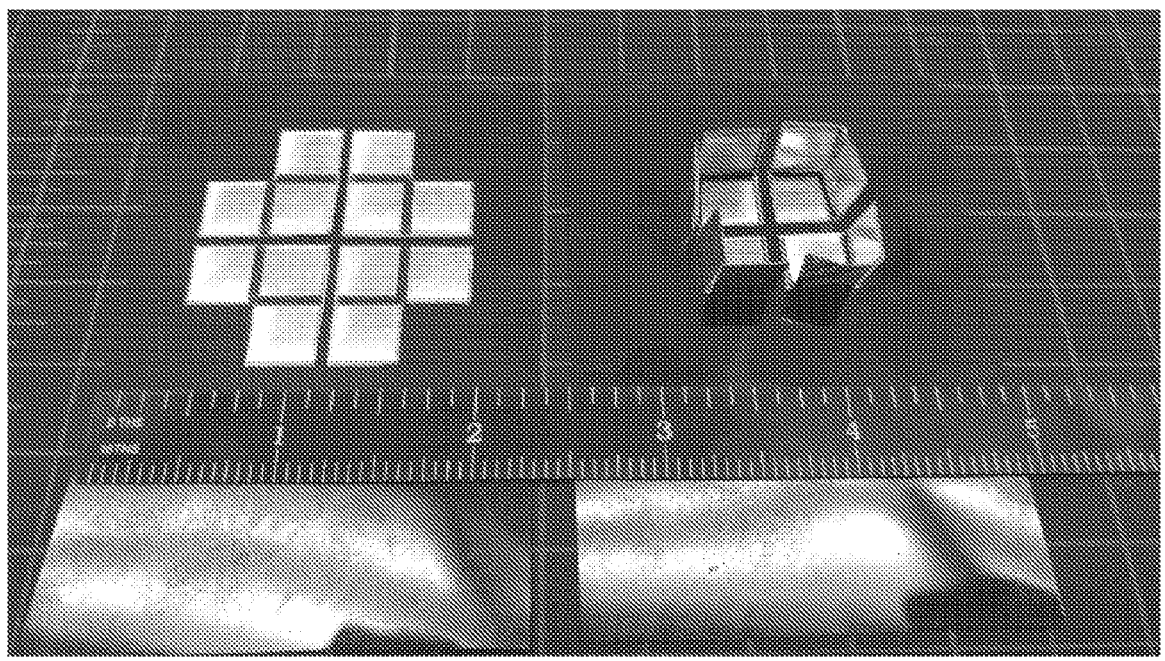

This example was made following the sample procedures detailed in example 1, except an adhesive backed reflective film (ESR 3M Company, St. Paul MN) was used. The adhesive pre-coating eliminated the need to laminate the double-coated tape to the pre-strained polymer film. Instead, the adhesive backed reflective film was laminate directly to the pre-strained polymer film. The construction and assembly formed transformation from a 2D structure to a 3D structure as shown in FIG. 21, where the self-folding array before heating is shown in the left image and the self-folding array after heating is shown in the right image.

TABLE 5

Laser parameters for example 4

| Laser Parameter | Value |
| --- | --- |
| cutting power | 60% (150 W) |
| pulse density | 1000 pulses/in |
| z-height | 2 mil |
| head speed | 35% |

3. Array of Self-Folding Reflective Polarizers

Figure 22:
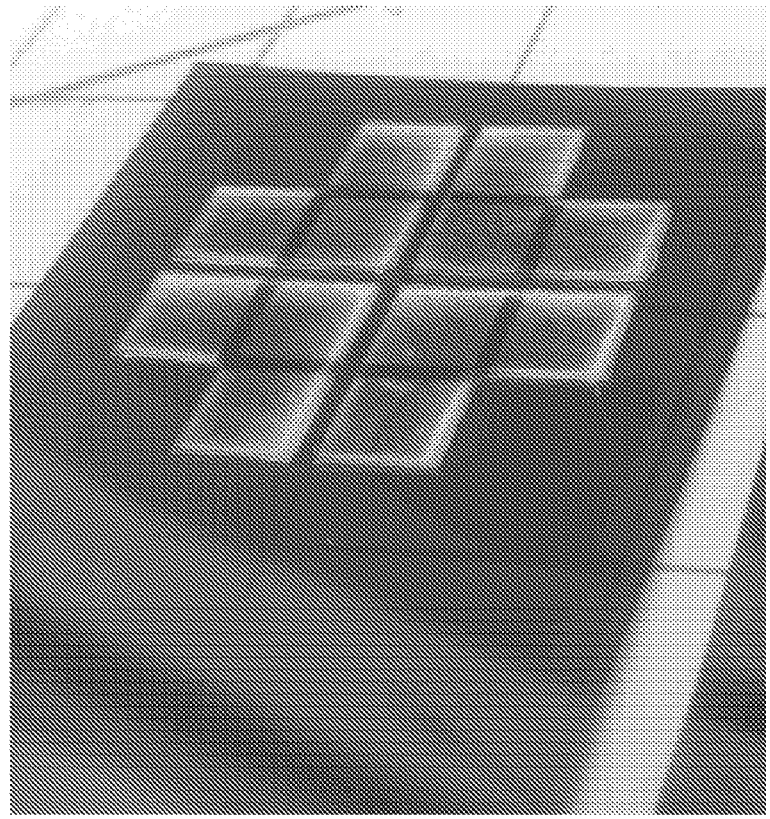
Figure 23:
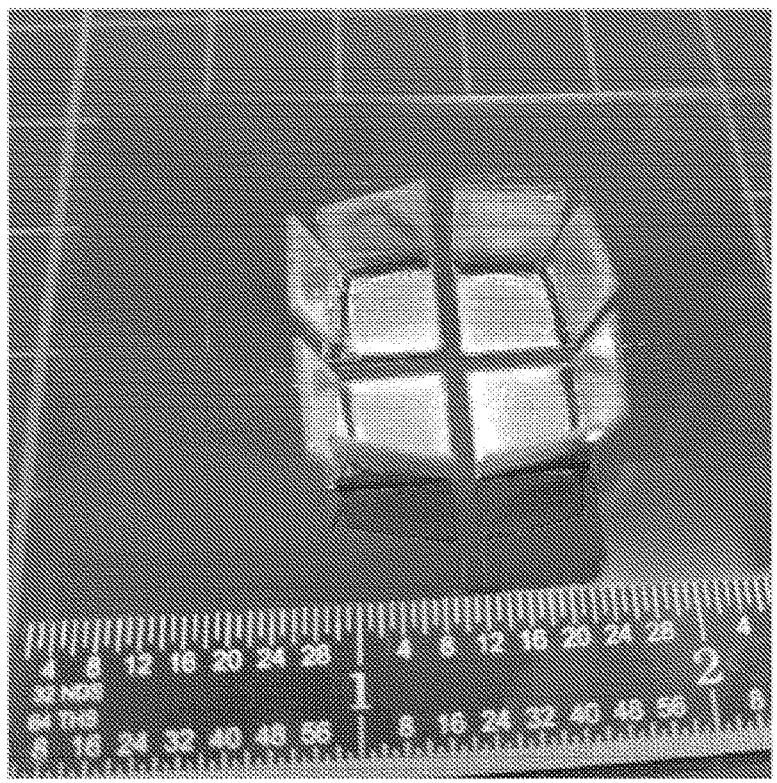

This example was made following the sample procedures detailed in example 1, except a reflective polarizer film (APF V3, 3M Company St. Paul MN) was used. The construction and assembly formed transformation from a 2D structure to a 3D structure as shown in FIGS. 22 and 23, where FIG. 22 is an image of the self-folding array before heating, and FIG. 23 is an image of the self-folding array after heating.

TABLE 6

Laser parameters for example 5

| Laser Parameter | Value |
| --- | --- |
| cutting power | 60% (150 W) |
| pulse density | 1000 pulses/in |
| z-height | 2 mil |
| head speed | 35% |

4. Patterned Cu Circuitry on Flexible Support Substrate

A copper on polyimide film (0.5 oz Cu on polyimide) was ablated and cut using a laser cutting system (ProtoLaser U3, LPKF Laser & Electronics AG Garbsen, DE). The pattern was cut such that the features were held in place on the film by a small tab on each side.

Figure 24:
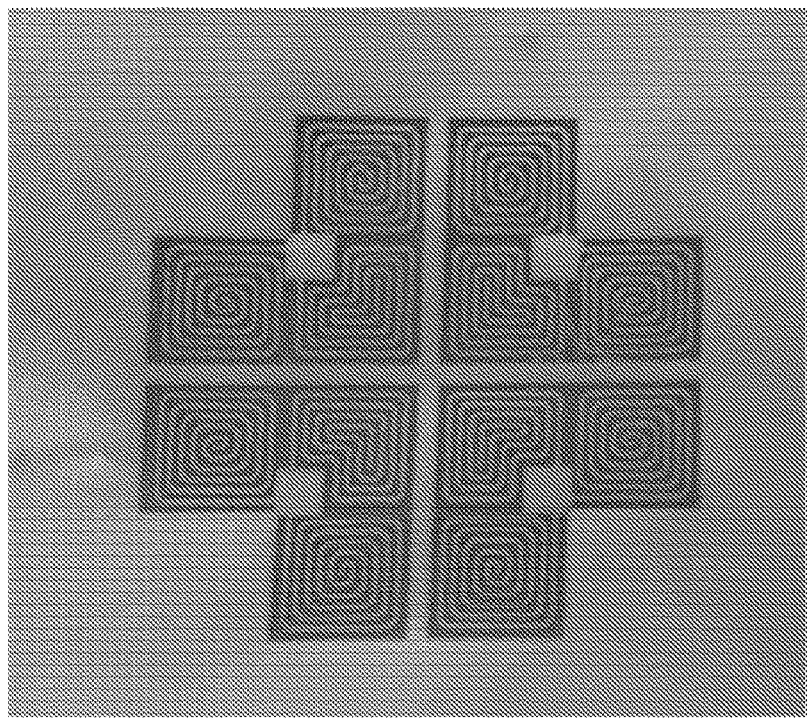
Figure 25:
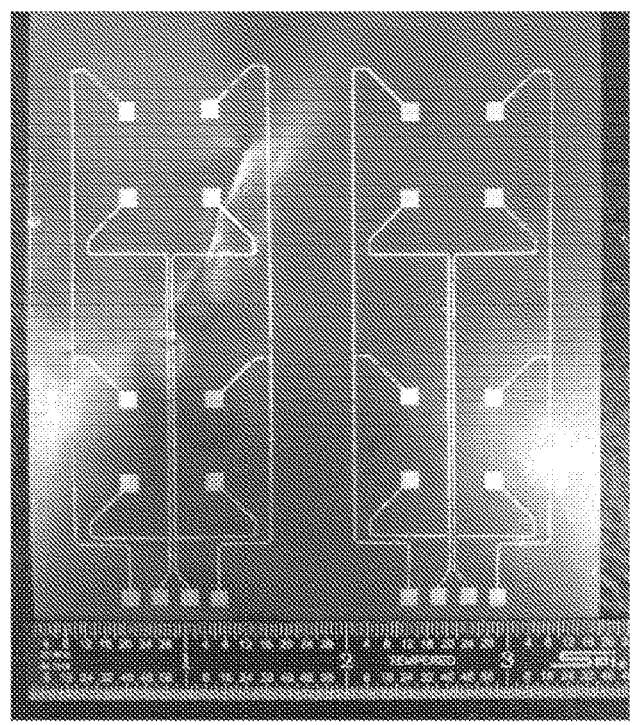

This circuitry patterning for the base bonding substrate was done via a chemical etch process. The desired pattern was printed onto a copper on polyimide film using a wax printer (Xerox ColorQube 8570). The substrate was then etched in a ferric chloride solution to remove the copper that was not protected by the printed wax. FIG. 24 is an image showing the element after etching, and FIG. 25 is an image showing the base circuitry after etching.

5. Self-Folding Array of Electronic Elements

Figure 26:
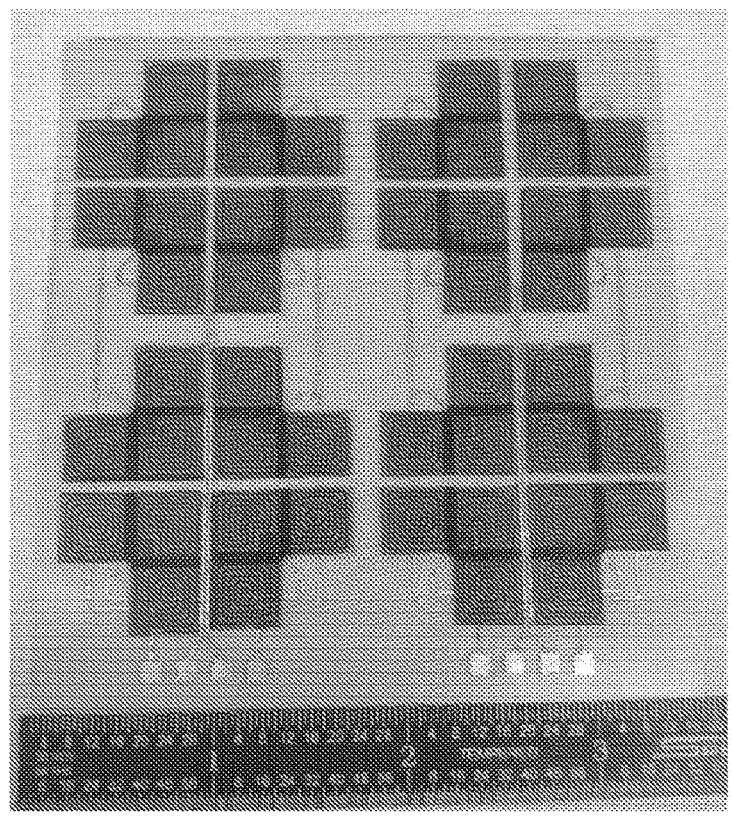
Figure 27:
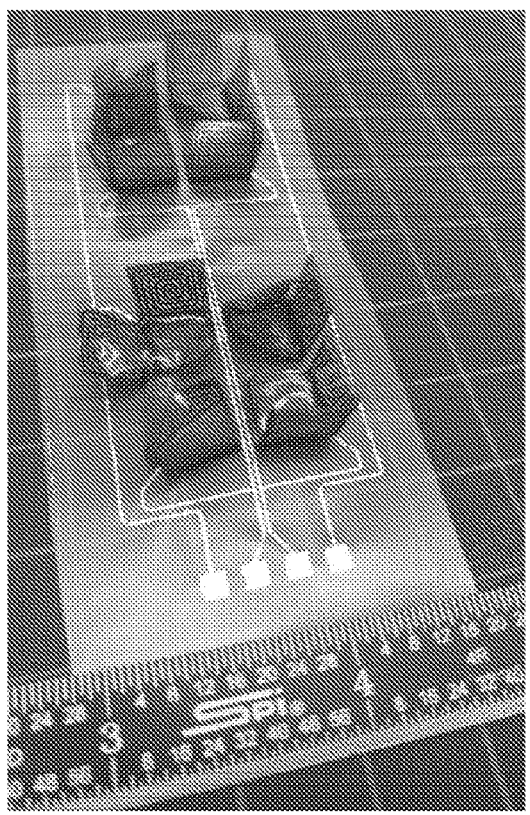

The example was made following the sample procedure detailed in example 1. Except this example used the flexible substrate containing electronic circuitry substrates detailed in example 6. To bond the array of elements to the circuitized flexible substrate, a conductive adhesive (9713, 3M Company St. Paul MN) was used to bond the base of the circuitized element to the circuitized substrate. The construction and assembly formed transformation from a 2D structure to a 3D structure as shown in FIGS. 26 and 27, where FIG. 26 is an image of the self-folding array before heating, and FIG. 27 is an image of the self-folding array after heating.

TABLE 7

Laser parameters for example 7

| Laser Parameter | Value |
| --- | --- |
| cutting power | 15% (150 W) |
| pulse density | 600 pulses/in |
| z-height | 2 mil |
| head speed | 10% |

The shaped pre-strained polymer actuators used to make folding assemblies in the following examples were optically transparent, pre-strained polystyrene sheets. When the assemblies were heated in an oven to a temperature T where T>Tg, the pre-strained polymer actuators shrunk and induced folding of the folding member.

Pre-cut functional film were laminated at specific points to the pre-strained polymer actuator sheets by adhesive. When the assembled of sheets and films were heated in an oven, the assembly of functional films formed 3D functional structure from their originally flat 2D form.

The process is compatible with roll-to-roll fabrication of the 2D assemblies.

6. Self-Folding Array of Half Cubes

Figure 28:
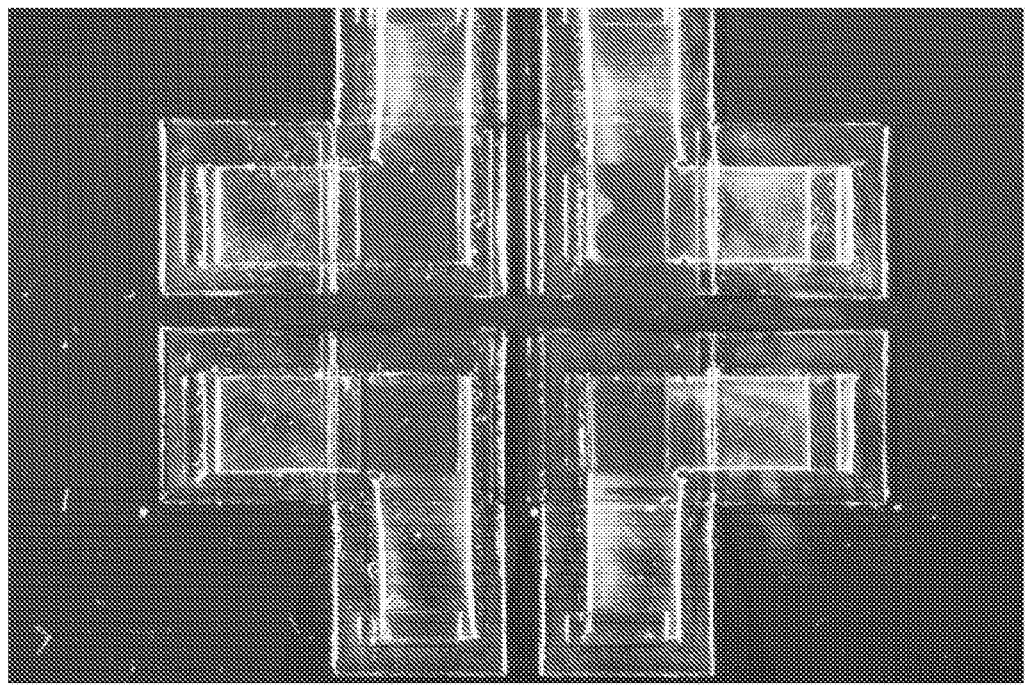
Figure 29:

General Description: The target article is an array of self-folding PET flexible members, each with an "L" shape of three square regions. The central square region is adhered to a flexible support substrate. The other two square regions are attached to the central square region by a hinge. A pre-strained film is bonded to the central square and the two square regions by an adhesive pad within each square. Upon exposure to a global heat source, the elements are designed to fold upwards by 90 degrees. FIGS. 28 and 29 are images showing these assemblies before heating (FIG. 28) and after heating (FIG. 29).

Flexible Support Substrate/Adhesive Laminate: A double-coated transfer tape with liner (94210, 3M Company St. Paul, MN) was kiss-cut using a laser cutting system (ILS10.150D, Universal Laser Systems, Scottsdale, AZ) to form isolated adhesive regions corresponding to the positions of the square base of each flexible folding member in the final assembly. The contiguous weed from the patterning step was removed to leave behind non-contiguous patterned adhesive segments on the tape backing. The patterned double coated tape was then hand laminated, adhesive side down, onto 5 mil KAPTON polyimide film (Dupont, Wilmington, DE). Once laminated, the tape liner was removed, leaving the patterned non-contiguous adhesive regions on the polyimide film.

TABLE 8

Laser parameters for 3M 94210 in Example 8

| Laser Parameter | Value |
| --- | --- |
| cutting power | 10% (150 W) |
| pulse density | 600 pulses/in |
| z-height | 2 mil |
| head speed | 25% |

Patterned element substrate: A double primed 3 mil PET film was laminated onto the adhesive pads on polyimide substrate. The PET film was then laser cut into the defined element shape using a laser cutter (ILS10.150D, Universal Laser Systems, Scottsdale, AZ). The laser cuts both defined the element shape and created a hinge to encourage where the fold lines will occur within the element.

TABLE 9

Laser parameters for 3 mil PET in Example 8

| Laser Parameter | Value |
| --- | --- |
| cutting power | 5% (150 W) |
| pulse density | 600 pulses/in |
| z-height | 2 mil |
| head speed | 60% |

Top Patterned Adhesive Laminate: A double-coated transfer tape with liner (94210, 3M Company St. Paul, MN) was kiss-cut using a laser cutting system (ILS10.150D, Universal Laser Systems, Scottsdale, AZ) to form isolated adhesive regions corresponding to the bonding regions of the pre-strained film on each of the squares of the flexible folding member in the final assembly. The contiguous weed from the patterning step was removed to leave behind non-contiguous patterned adhesive segments on the tape backing. The patterned double coated tape was then hand laminated, adhesive side down, onto patterned element substrate. Once laminated, the tape liner was removed, leaving the patterned non-contiguous adhesive regions on the PET film.

Patterned Pre-Strained Polymer: A 1 mil pre-strained film on liner was laser kiss cut to form isolated patterned actuators. The pre-strained film was laminated onto the adhesive regions of the four-layer assembly in registration so that the patterned first adhesive layer was aligned to the square base region of the pre-strained polymer laminate. The liner and contiguous region of the pre-strained film was then removed to complete the final assembly.

TABLE 10

Laser parameters for pre-strained film in Example 8

| Laser Parameter | Value |
|---|---|
| cutting power | 2% (150 W) |
| pulse density | 600 pulses/in |
| z-height | 2 mil |
| head speed | 60% |

Activating the Elements: The self-folding array was placed in an oven at 160° C. for 60 seconds, over which the features exhibited self-folding to their final position as shown in the image of FIG. 29.

7. Array of Self-Folding Elements with Shaped Actuators

Figure 30:
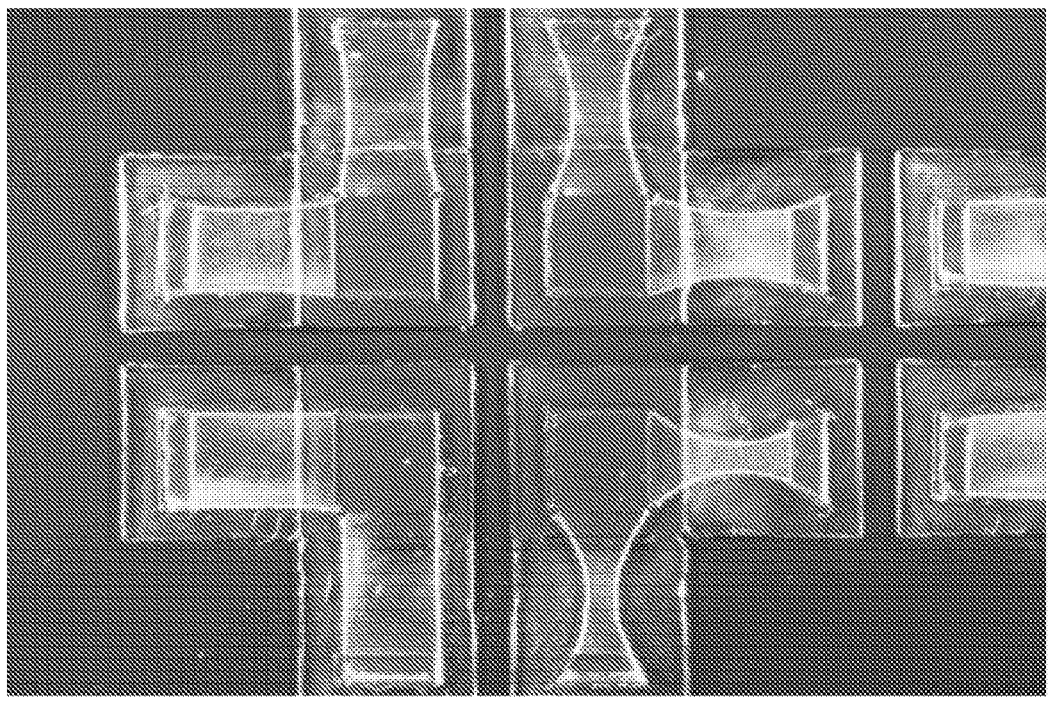

This example was made following the sample procedures detailed in example 6, except the pre-strained polymer film was laser cut to a digital designed pattern. FIG. 30 is an image showing the assembled 2D construction with shaped actuators before heating.

8. Array of Self-Folding Elements with Conductive Adhesive

Figure 31:
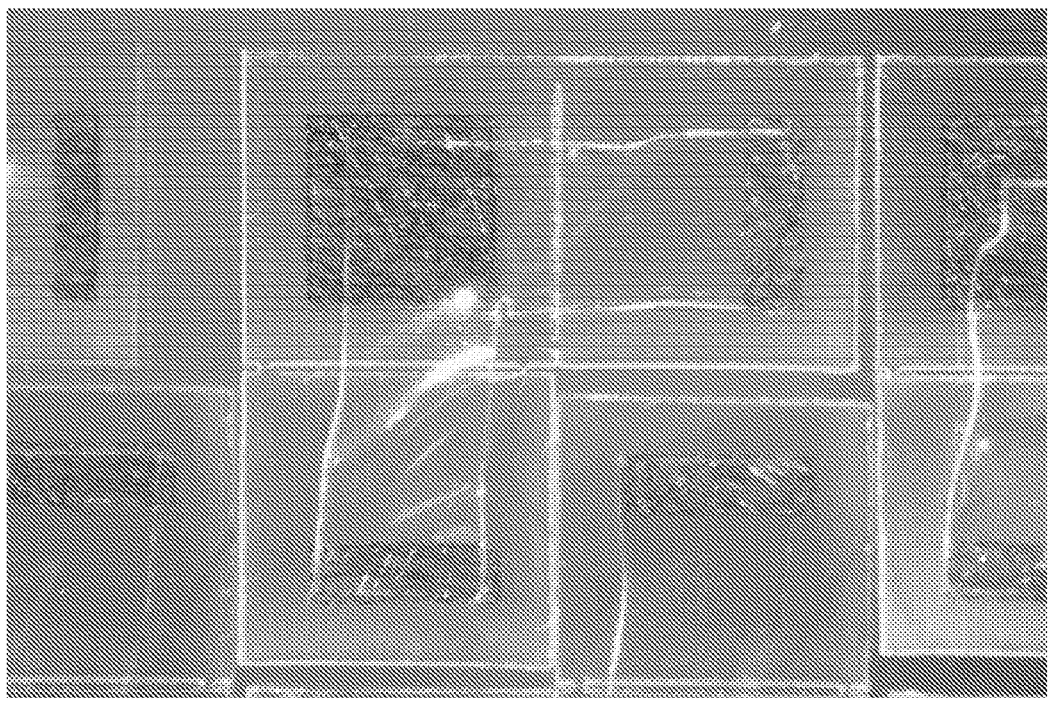

This example was made following the sample procedures detailed in example 6, except a conductive adhesive was used to adhere the elements to the substrate (9713, 3M Company St. Paul MN) was used. This would allow the elements to contain functional electronic circuitry that is bonded to a circuitized flexible substrate. The construction and assembly formed transformation from a 2D structure to a 3D structure as shown in FIG. 31, which is an image of the self-folding array with conductive adhesive.

TABLE 11

Laser parameters for 3M 9713 in Example 10

| Laser Parameter | Value |
|---|---|
| cutting power | 15% (150 W) |
| pulse density | 600 pulses/in |
| z-height | 2 mil |
| head speed | 10% |

The shaped uniaxial pre-strained polymer actuators used to make folding assemblies in the following examples were optically transparent, pre-strained polystyrene sheets. When the assemblies were heated in an oven to a temperature T where T>Tg, the uniaxial pre-strained polymer actuators shrunk and induced folding of the folding member.

Pre-cut functional film were laminated at specific points to the uniaxial pre-strained polymer actuator sheets by adhesive. When the assembled of sheets and films were heated in an oven, the assembly of functional films formed 3D functional structure from their originally flat 2D form.

The process is compatible with roll-to-roll fabrication of the 2D assemblies.

Figure 32:
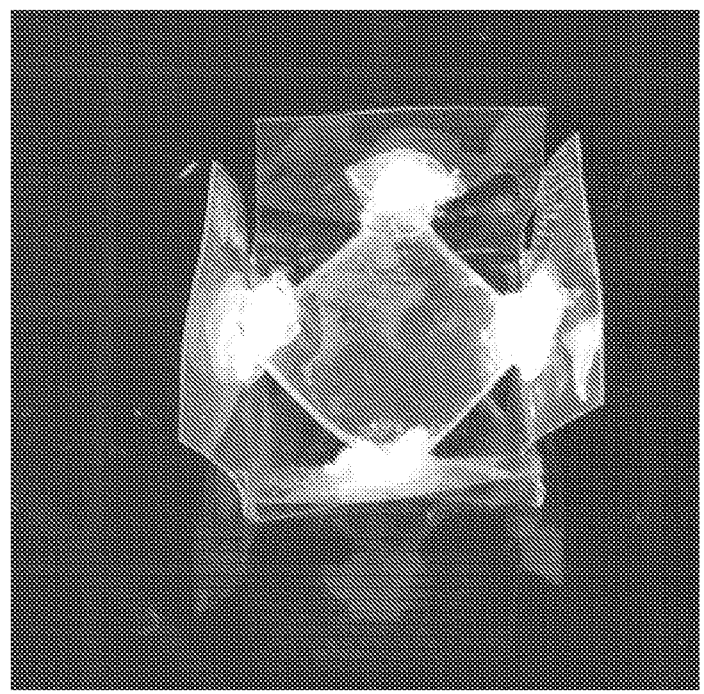

9. Self-Folding Array of Cubes with Isotropic Uniaxial Pre-Strained Polymer Actuators General Description: The target article is an array of self-folding PET flexible members, each with a bonded pre-strained polymer actuator (uniaxial pre-strained polymer actuator) that can be inline or at an angle relative to the folding axis of the flexible member. The uniaxial pre-strained polymer actuator sheets are anisotropically strained, such that the actuation of the flexible member is limited to one axis. This allows for the fold angle and orientation to be tunable based on the relative angle between the two members. The uniaxial pre-strained polymer actuator can be bonded to the flexible folding member via dispensed adhesive, laser bonding, and adhesive laminate. Upon exposure to a global heat source, the elements are designed to fold upwards by 90 degrees if the uniaxial pre-strained polymer actuator strain axis is perpendicular to the folding axis. The fold angle can be controlled by varying the angle between the uniaxial pre-strained polymer actuator strain axis and the hinge axis. FIG. 32 is an image of the self-folding cube with isotropic uniaxial pre-strained polymer actuator and is an example corresponding with the embodiment shown in FIG. 16A.

Flexible Support Substrate/Adhesive Laminate: A double-coated transfer tape with liner (94210, 3M Company St. Paul, MN) was kiss-cut using a laser cutting system (ILS10.150D, Universal Laser Systems, Scottsdale, AZ) to form isolated adhesive regions corresponding to the positions of the square base of each flexible folding member in the final assembly. The contiguous weed from the patterning step was removed to leave behind non-contiguous patterned adhesive segments on the tape backing. The patterned double coated tape was then hand laminated, adhesive side down, onto 5 mil KAPTON polyimide film (Dupont, Wilmington, DE). Once laminated, the tape liner was removed, leaving the patterned non-contiguous adhesive regions on the polyimide film.

TABLE 12

Laser parameters for 3M 94210 in Example 11

| Laser Parameter | Value |
|---|---|
| cutting power | 10% (150 W) |
| pulse density | 600 pulses/in |
| z-height | 2 mil |
| head speed | 25% |

Patterned element substrate: A double primed 3 mil PET film was laminated onto the adhesive pads on polyimide substrate. The PET film was then laser cut into the defined element shape using a laser cutter (ILS10.150D, Universal Laser Systems, Scottsdale, AZ). The laser cuts both defined the element shape and created a hinge to encourage where the fold lines will occur within the element. To increase the folding capacity of the hinge, it is critical that the bonding points be placed where leverage can be maximized.

TABLE 13

Laser parameters for 3 mil PET in Example 11

| Laser Parameter | Value |
|---|---|
| cutting power | 5% (150 W) |
| pulse density | 600 pulses/in |
| z-height | 2 mil |
| head speed | 60% |

Patterned Pre-Strained Actuators: To produce a patterned actuator, a sheet of pre-strained polymer film (Ink Jet Shrink Film, GRAFIX film) was cut to size via laser kiss cut to form isolated patterned actuators.

TABLE 14

Laser parameters for pre-strained film in Example 11

| Laser Parameter | Value |
|---|---|
| cutting power | 2% (150 W) |
| pulse density | 600 pulses/in |
| z-height | 2 mil |
| head speed | 60% |

Top Patterned Adhesive: A cyanoacrylate adhesive (Scotch General Purpose Super Glue, 3M Company, St. Paul, MN) was dispensed in registered locations on the patterned element substrate to bond the patterned uniaxial pre-strained polymer actuator film together. To cure the adhesive, the assembly was left for 30 minutes at 25° C.

A double-coated transfer tape with liner (94210, 3M Company St. Paul, MN) was kiss-cut using a laser cutting system (ILS10.150D, Universal Laser Systems, Scottsdale, AZ) to form isolated adhesive regions corresponding to the bonding regions of the pre-strained film on each of the squares of the flexible folding member in the final assembly. The contiguous weed from the patterning step was removed to leave behind non-contiguous patterned adhesive segments on the tape backing. The patterned double coated tape was then hand laminated, adhesive side down, onto patterned element substrate. Once laminated, the tape liner was removed, leaving the patterned non-contiguous adhesive regions on the PET film.

Patterned Pre-Strained Polymer: The pre-strained film was laminated onto the adhesive regions of the four-layer assembly in registration so that the patterned first adhesive layer was aligned to the square base region of the pre-strained polymer laminate.

Activating the Elements: The self-folding array was placed in an oven at 160° C. for 60 seconds, over which the features exhibited self-folding to their final position.

10. Self-Folding Array of Cubes where the Fold Axis and Uniaxial Pre-Strained Polymer Actuator Actuation Axis are Aligned This example was made following the sample procedures detailed in example 9, except an anisotropic uniaxial pre-strained polymer actuator was used to actuate the elements. This would allow the elements to be tunable based on the orientation of the strain axis in relation to the folding axis.

Patterned Anisotropically Pre-Strained Actuators: To produce an anisotropically strained film, a sheet of pre-strained polymer film (Ink Jet Shrink Film, GRAFIX film) was mounted in a fixtured the restrained the top and bottom edges. The fixture was placed in an oven for 20 minutes at 160° C. The fixture was then removed and allowed to cool. The film was then removed from the fixture and cut down to size via laser kiss cut to form isolated patterned actuators.

TABLE 15

Laser parameters for pre-strained film in Example 12

| Laser Parameter | Value |
|---|---|
| cutting power | 2% (150 W) |
| pulse density | 600 pulses/in |
| z-height | 2 mil |
| head speed | 60% |

Figure 33:
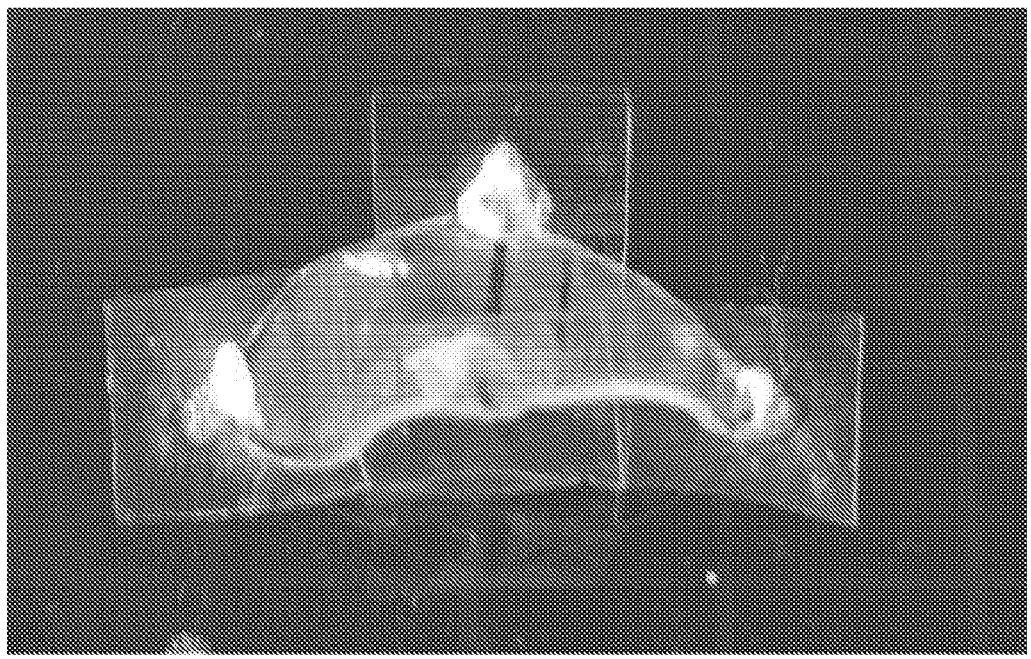

In this example 12, the strain axis was aligned with one of the folding axis of the box, but perpendicular to the other folding axis. The resulting example selectively actuates two of the folds while leaving the other two down. The construction and assembly formed transformation from a 2D structure to a 3D structure as shown in FIG. 33 and corresponding with the embodiment shown in FIG. 16B. FIG. 33 is an image of the self-folding cube where the uniaxial pre-strained polymer actuator strain axis is parallel to one axis of the cube.

Figure 34:
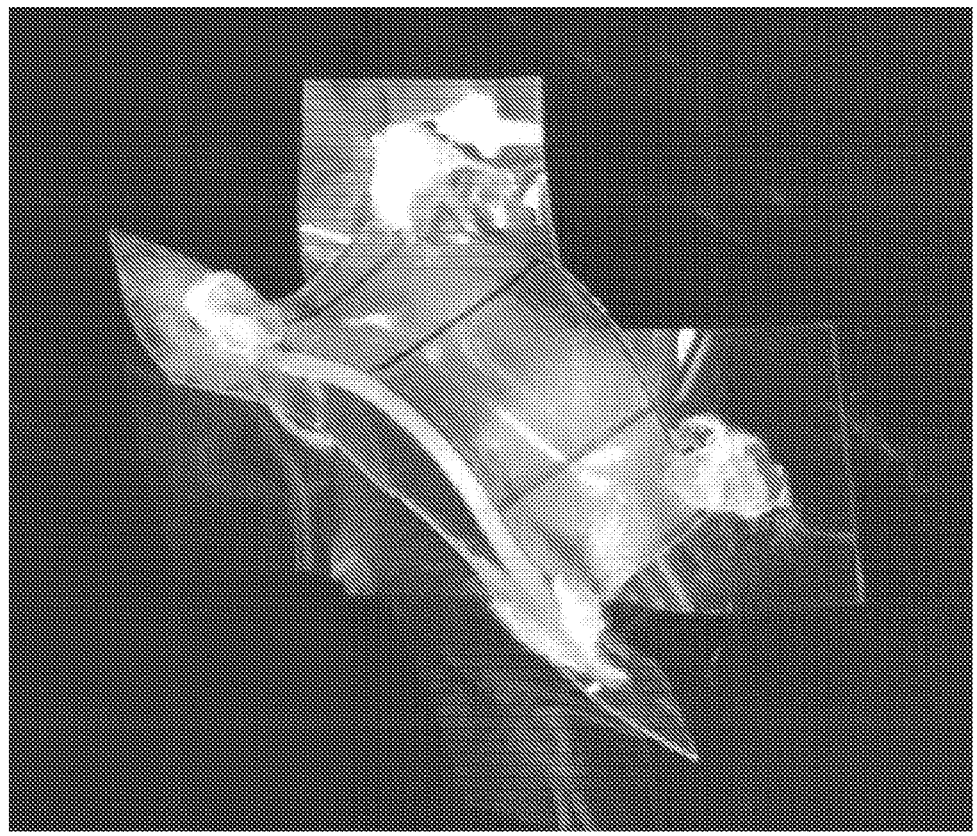

11. Self-Folding Array of Cubes where the Uniaxial Pre-Strained Polymer Actuator Actuation Axis is Fixed and Independent of the Fold Axis This example was made following the sample procedures detailed in example 10, except the strain axis of the anisotropic uniaxial pre-strained polymer actuator film was bonded to the element substrate perpendicular to both folding axis of the box. This example raises all folding tabs partially. The construction and assembly formed transformation from a 2D structure to a 3D structure as shown FIG. 34 and corresponding with the embodiment shown in FIG. 16C. FIG. 34 is an image of the self-folding cube where the uniaxial pre-strained polymer actuator strain axis is perpendicular to both cube folding axis.

Figure 35:
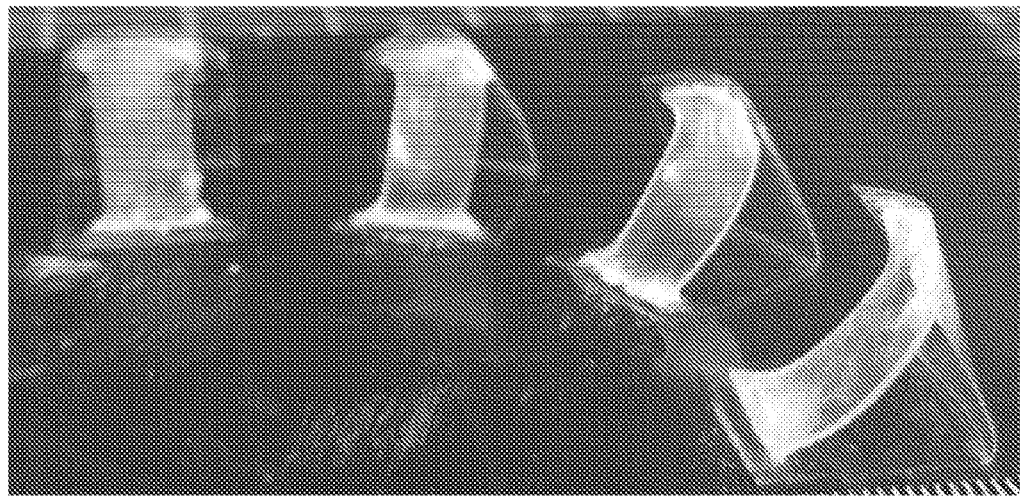

12. Self-Folding 90° Array with an Isotropic Uniaxial Pre-Strained Polymer Actuator This example was made following the sample procedures detailed in example 9, except the arrangement is in a 90° array comprised of single fold elements. This arrangement would allow the elements to fold into a 3D form. The construction and assembly formed transformation from a 2D structure to a 3D structure as shown in FIG. 35 and corresponding with the embodiment shown in FIG. 14. FIG. 35 is an image of the heat activated self-folding 90° array where the uniaxial pre-strained polymer actuator strain axis is parallel to the fold axis.

Figure 36:
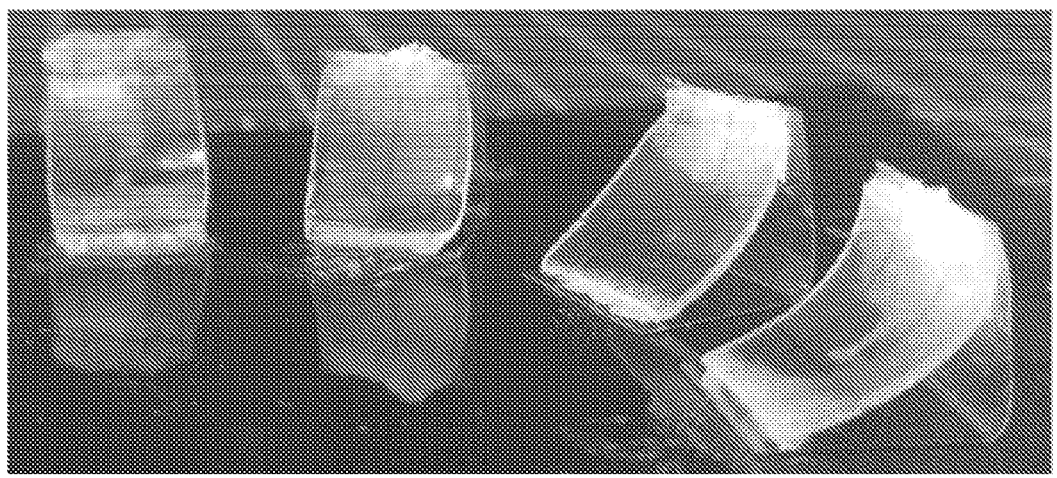

13. Self-Folding 90° Array where the Fold Axis and Uniaxial Pre-Strained Polymer Actuator Actuation Axis are Aligned This example was made following the sample procedures detailed in example 12, except the pre-strained polymer film is anisotropic. In this example, the strain axis of the uniaxial pre-strained polymer actuator is parallel to the folding direction of the element. The construction and assembly formed transformation from a 2D structure to a 3D structure as shown in FIG. 36 and corresponding with the embodiment shown in FIG. 15. FIG. 36 is an image of the self-folding 90° array where the uniaxial pre-strained polymer actuator strain axis is independent of the fold axis.

Figure 37:
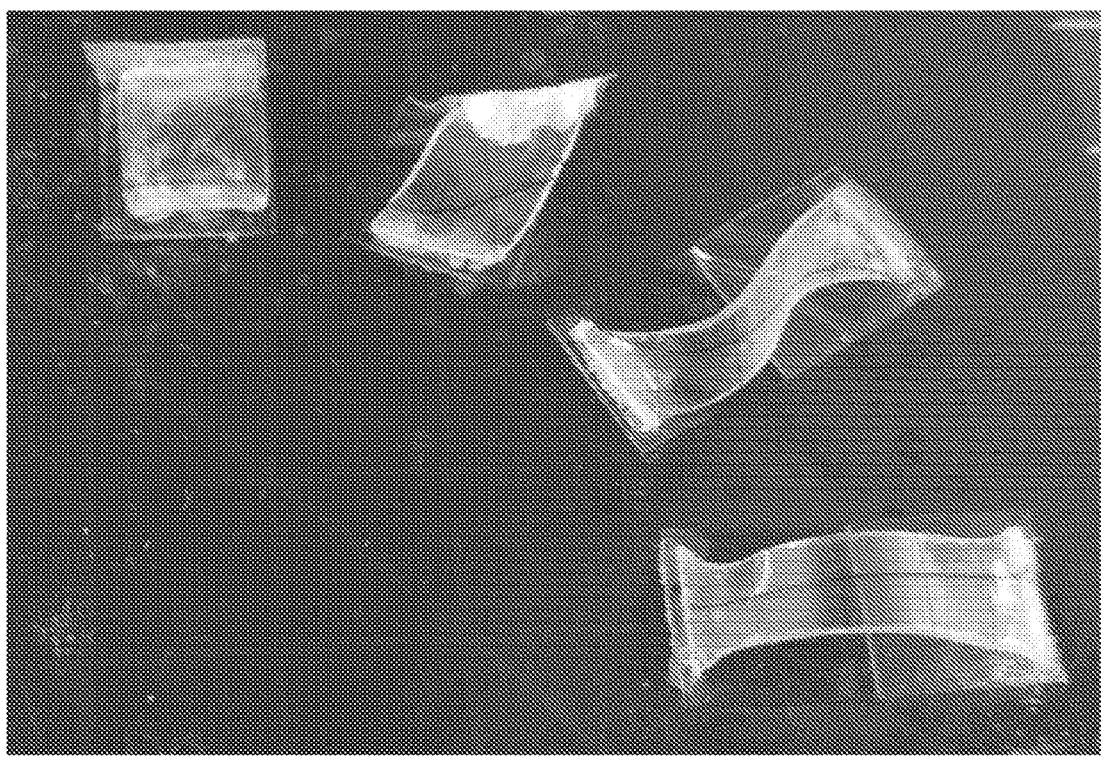

14. Self-Folding 90° Array where the Uniaxial Pre-Strained Polymer Actuator Pre-Strain Axis is Fixed and Independent of the Fold Axis This example was made following the sample procedures detailed in example 13, except the anisotropic pre-strained polymer film is independent of the folding elements. The construction and assembly formed transformation from a 2D structure to a 3D structure as shown in FIG. 37 and corresponding with the embodiment shown in FIG. 15. FIG. 37 is an image of the self-folding 90° array where the uniaxial pre-strained polymer actuator strain axis is independent of the fold axis.

The invention claimed is:

1. A folded film assembly, comprising:
a planar flexible circuitized support substrate defining a plane xy with conductive lines and pads;
an array of conductive adhesive elements;
an array of circuitized flexible folded members with conductive lines and pads, the folding members comprising a base, at least folded region, and at least one hinge adjacent each folded region attached at the base to the flexible support substrate by at least one of the adhesive elements;
an array of pre-strained thermoplastic polymer actuators co-extensive with each of the flexible folding members; and
a patterned light to heat conversion layer,
wherein the conductive pads of the support substrate are electrically connected to the conductive pads of at least one folded member by a conductive adhesive element and the folded region is not in the plane xy.

2. The folded film assembly of claim 1, wherein the polymer actuators are shaped to be not co-extensive with the folded members.

3. The folded film assembly of claim 1, wherein the polymer actuators are adhered to the folded members at a plurality of attachment points.

4. The folded film assembly of claim 1, wherein the polymer actuators comprise multi-element arrays.

5. The folded film assembly of claim 1, wherein the polymer actuators comprise mixed arrays.

6. The folded film assembly of claim 1, wherein the polymer actuators are overlapped, interleaved, or woven with one another.

7. The folded film assembly of claim 1, wherein the polymer actuators are sequenced.

8. The folded film assembly of claim 1, wherein the polymer actuators are embossed.

9. A substantially planar self-folding film assembly, comprising:
a flexible support substrate;
an array of adhesive elements;
an array of flexible folding members, each comprising a base, at least one folding region, and at least one pre-strained polymer actuator having a shape, a thickness, a glass transition temperature; and
a light to heat converting die or coating attached to the folding member,
wherein the pre-strained polymer actuator is not co-extensive with the folding member.

10. The self-folding film assembly of claim 9, wherein the pre-strained polymer actuator is attached to the folding member with a point bond comprising an adhesive bond, a laser weld, an ultrasonic bond, or a mechanical point fastener.

11. The self-folding film assembly of claim 9, wherein the array of flexible folding members comprises shaped pre-strained polymer actuators with differing shape, thickness, glass transition temperature, or light to heat converting die or coating.

12. A substantially planar self-folding film assembly, comprising:
a flexible support substrate;
an array of adhesive elements;
an array of flexible folding members, each comprising a base, at least one folding region, and at least one pre-strained polymer actuator composite having a shape, a thickness, a glass transition temperature; and
a light to heat converting die or coating attached to the folding member,
wherein the pre-strained polymer actuator composite comprises overlapped, interleaved, or woven individual shaped pre-strained polymer actuator elements.

13. The self-folding film assembly of claim 12, wherein at least two folding members are actuated sequentially.

* * * * *